United States Patent
Lin et al.

(10) Patent No.: US 11,195,938 B2
(45) Date of Patent: Dec. 7, 2021

(54) DEVICE PERFORMANCE BY FLUORINE TREATMENT

(71) Applicant: TAIWAN SEMICONDUCTOR MANUFACTURING, CO., LTD., Hsinchu (TW)

(72) Inventors: Cheng-Ming Lin, Kaohsiung (TW); Sai-Hooi Yeong, Zhubei (TW); Chi-On Chui, Hsinchu (TW); Ziwei Fang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/526,650

(22) Filed: Jul. 30, 2019

(65) Prior Publication Data
US 2021/0036127 A1 Feb. 4, 2021

(51) Int. Cl.
| | |
|---|---|
| *G11C 11/22* | (2006.01) |
| *H01L 21/28* | (2006.01) |
| *H01L 27/1159* | (2017.01) |
| *H01L 29/78* | (2006.01) |
| *H01L 21/283* | (2006.01) |
| *H01L 21/3205* | (2006.01) |
| *H01L 29/06* | (2006.01) |
| *H01L 29/66* | (2006.01) |
| *H01L 29/51* | (2006.01) |
| *H01L 21/02* | (2006.01) |
| *H01L 29/423* | (2006.01) |

(52) U.S. Cl.
CPC ...... *H01L 29/6684* (2013.01); *H01L 21/0234* (2013.01); *H01L 29/516* (2013.01); *H01L 29/66795* (2013.01); *H01L 29/7851* (2013.01); *H01L 29/42392* (2013.01)

(58) Field of Classification Search
CPC ............. H01L 29/6684; H01L 21/0234; H01L 29/516; H01L 29/66795
See application file for complete search history.

(56) References Cited

U.S. PATENT DOCUMENTS

| | | | |
|---|---|---|---|
| 2015/0303057 A1* | 10/2015 | Lee | H01L 21/0234 257/410 |
| 2017/0170027 A1* | 6/2017 | Hou | H01L 21/3215 |
| 2018/0033619 A1* | 2/2018 | Liu | H01L 21/0234 |
| 2018/0145156 A1* | 5/2018 | Li | H01L 21/3085 |
| 2019/0164765 A1* | 5/2019 | Yeoh | H01L 21/823807 |
| 2019/0207009 A1* | 7/2019 | Yamaguchi | H01L 29/516 |
| 2019/0355584 A1* | 11/2019 | Yamaguchi | G11C 11/2259 |
| 2020/0403081 A1* | 12/2020 | Sung | H01L 29/775 |

OTHER PUBLICATIONS

Wu et al., "Fluorinated Hf02 Gate Dielectrics Engineering for CMOS by pre- and post-CF4 Plasma Passivation", IEEE International Electron Devices Meeting, 2008, 4 pages.

* cited by examiner

*Primary Examiner* — Brian Turner
(74) *Attorney, Agent, or Firm* — Birch, Stewart, Kolasch & Birch, LLP

(57) ABSTRACT

A method for forming a semiconductor structure is provided. The method includes patterning a semiconductor substrate to form a semiconductor fin, forming a source/drain structure on the semiconductor fin, forming an interfacial layer on the semiconductor fin, treating the interfacial layer with fluorine, forming a ferroelectric gate dielectric layer on the interfacial layer, treating the ferroelectric gate dielectric layer with fluorine, and forming a gate electrode layer on the ferroelectric gate dielectric layer.

20 Claims, 20 Drawing Sheets

DEVICE PERFORMANCE BY FLUORINE TREATMENT

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

Although existing semiconductor manufacturing processes have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
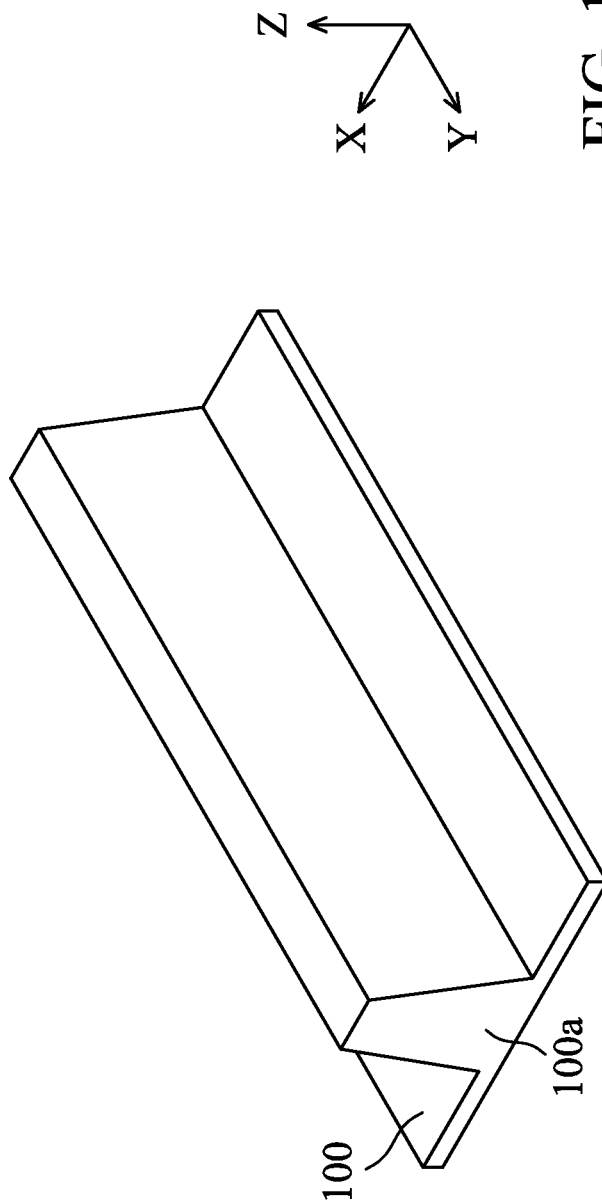
FIGS. 1A, 1B, and 1C are a series of perspective views illustrating various stages of a method for forming a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The fin structures (e.g., semiconductor fins) described below may be patterned using any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

Embodiments of methods for forming semiconductor structures are provided. The method may include forming an interfacial layer on a semiconductor fin, forming a gate dielectric layer on the interfacial layer, and forming a gate electrode layer on the gate dielectric layer. The interfacial layer and the gate dielectric layer may be treated with fluorine, so that the device performance may be improved.

Figure 1B:
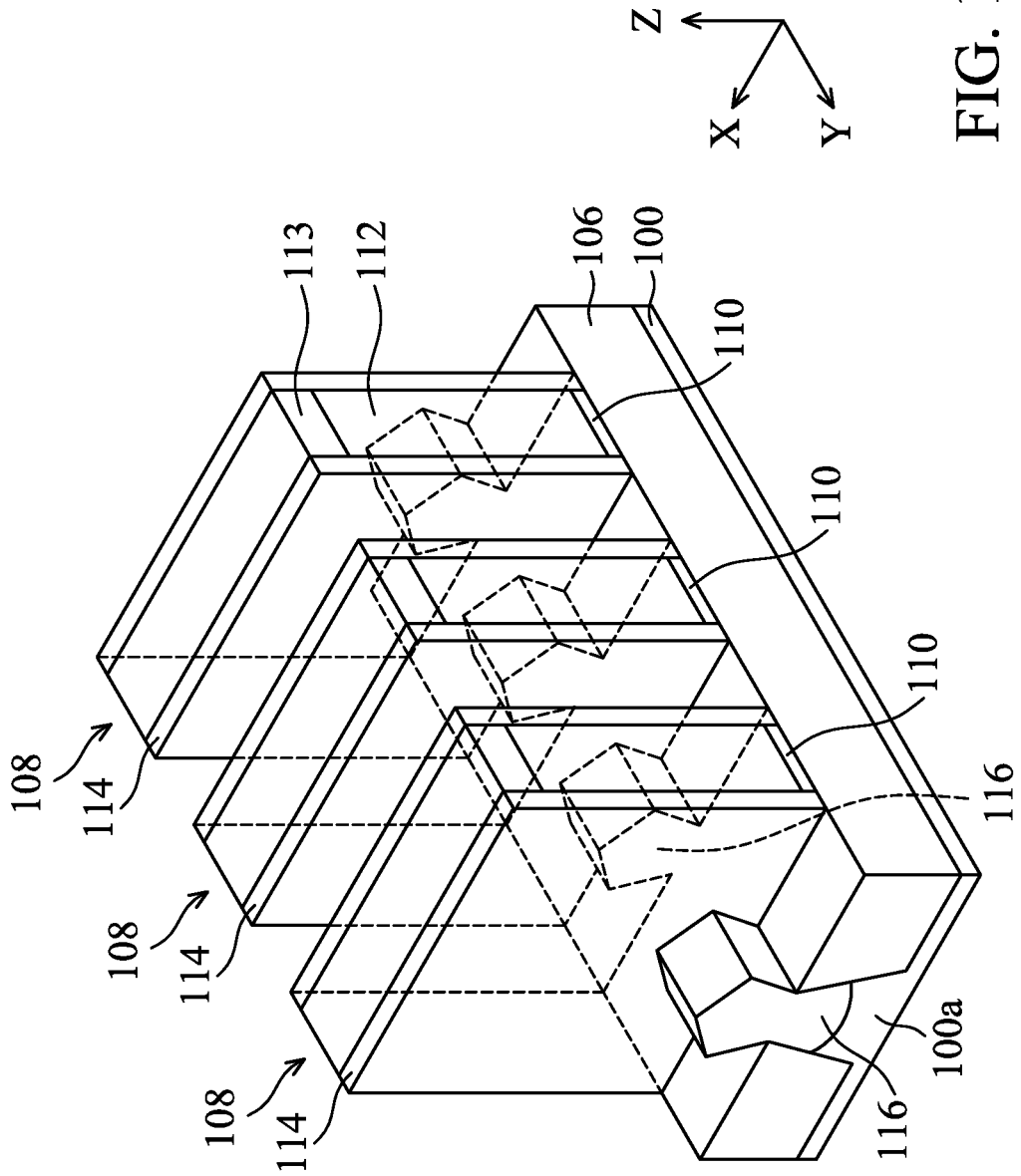
Figure 1C:
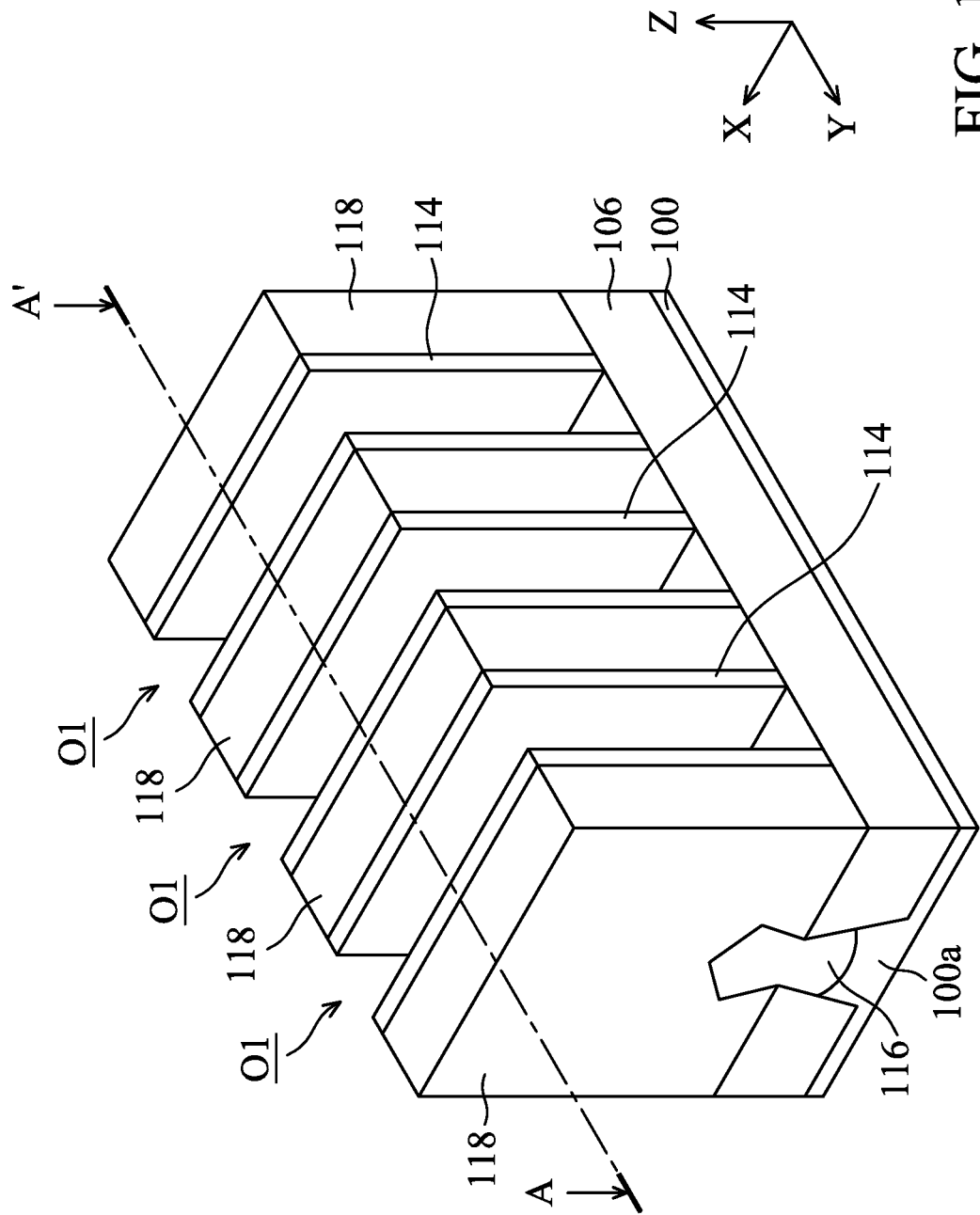

FIGS. 1A, 1B, and 1C are a series of perspective views illustrating various stages of a method for forming a semiconductor structure in accordance with some embodiments of the present disclosure. FIGS. 2A, 2B, 2C, 2D, 2E, 2F, 2G, 2H, 2I, 2J, 2K, and 2L are a series of cross-sectional views taken along line A-A' shown in FIG. 1C and illustrates various stages of a method for forming a semiconductor structure in accordance with some embodiments of the present disclosure.

A semiconductor substrate 100 is provided, as shown in FIG. 1A in accordance with some embodiments. The semiconductor substrate 100 may be a semiconductor wafer such as a silicon wafer. The semiconductor substrate 100 may include a IV-group material, a II-VI-group material, a III-V-group material, another applicable material, or a combination thereof.

In some embodiments, the semiconductor substrate 100 includes elementary semiconductor materials, compound semiconductor materials, alloy semiconductor materials, or a combination thereof. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 100 includes an epitaxial layer. For example, the semiconductor substrate 100 may have an epitaxial layer overlying a bulk semiconductor. In some embodiments, the semiconductor substrate 100 includes a semiconductor-on-insulator (SOI) substrate (e.g., a silicon-on-insulator substrate, a germanium-on-insulator substrate, or another applicable SOI substrate). The SOI substrate may be fabricated using a wafer bonding process, a silicon film transfer process, a separation by implantation of oxygen (SIMOX) process, another applicable process, or a combination thereof.

Various active elements (not shown) may be formed in and/or over the semiconductor substrate 100. Examples of the various active elements include transistors, diodes, another applicable element, or a combination thereof. For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs). In some embodiments, the semiconductor substrate 100 includes a fin field effect transistor (FinFET). Various passive elements (not shown) may be formed in and/or over the semiconductor substrate 100. Examples of the various passive elements include capacitors, inductors, resistors, another applicable passive element, or a combination thereof. Various processes, such as front-end-of-line (FEOL) semiconductor fabrication processes, may be performed to form the various active elements and passive elements. The FEOL semiconductor fabrication processes may include deposition, etching, implantation, lithography, annealing, planarization, one or more other applicable processes, or a combination thereof.

Afterwards, the semiconductor substrate 100 is patterned to form a semiconductor fin 100a, as shown in FIG. 1A in accordance with some embodiments. The semiconductor fin 100a may protrude from the semiconductor substrate 100 along direction Z perpendicular to the top surface of the semiconductor substrate 100, as shown in FIG. 1A. The semiconductor fin 100a may extend in direction Y, as shown in FIG. 1A, and direction Y may be the lengthwise direction of the semiconductor fin 100a. Direction X may be perpendicular to direction Y, as shown in FIG. 1A, and direction X may be the widthwise direction of the semiconductor fin 100a.

In some embodiments, the semiconductor fin 100a has tapered sidewalls. For example, the semiconductor fin 100a may have a width that gradually increases from the top portion to the lower portion.

Although FIG. 1A illustrates only one semiconductor fin 100a, multiple semiconductor fins (e.g., multiple semiconductor fins 100a) may be formed on the semiconductor substrate 100 in accordance with some embodiments of the present disclosure. These semiconductor fins formed on the semiconductor substrate 100 may be parallel to each other in their lengthwise directions.

In some embodiment, before the semiconductor substrate 100 is patterned to form the semiconductor fin 100a, a first mask layer (not shown in the figures) and a second mask layer (not shown in the figures) are successively formed over the semiconductor substrate 100. In some embodiments, the first mask layer serves a buffer layer or an adhesion layer that is formed between the underlying semiconductor substrate 100 and the overlying second mask layer. The first mask layer may also be used as an etch stop layer when the second mask layer is removed or etched.

In some embodiments, the first mask layer is made of silicon oxide. In some embodiments, the first mask layer is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on coating process, another applicable process, or a combination thereof.

In some embodiments, the second mask layer is made of silicon oxide, silicon nitride, silicon oxynitride, another applicable material, or a combination thereof. In some embodiments, the second mask layer is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on coating process, another applicable process, or a combination thereof.

In some embodiments, after the formation of the first mask layer and the second mask layer, the first mask layer and the overlying second mask layer are patterned by a photolithography process and an etching process, so as to expose portions of the semiconductor substrate 100. For example, the photolithography process may include photoresist coating (e.g., spin-on coating), soft baking, mask aligning, exposure, post-exposure baking, developing the photoresist, rinsing and drying (e.g., hard baking). Moreover, the etching process may be a dry etching process, such as a reactive ion etching (RIE) process, a neutral beam etching (NBE) process, the like, or a combination thereof.

Afterwards, an etching process is performed on the semiconductor substrate 100 to form the semiconductor fin 100a by using the patterned first mask layer and the patterned second mask layer as an etch mask, in accordance with some embodiments. In some embodiments, the etching process includes a dry etching process, a wet etching process, or a combination thereof. In some embodiments, the semiconductor substrate 100 is etched by a dry etching process, such as an RIE process, an NBE process, the like, or a combination thereof. The dry etching process may be performed using a process gas including fluorine-containing etchant gas. For example, the process gas may include $SF_6$, $C_xF_y$ (x and y are both integers), $NF_3$, or a combination thereof.

After the semiconductor fin 100a is formed, an isolation structure 106 is formed over the semiconductor substrate 100, and the semiconductor fin 100a is surrounded by the isolation structure 106, as shown in FIG. 1B in accordance with some embodiments. The isolation structure 106 may be formed by depositing an insulating layer over the semiconductor substrate 100 and recessing the insulating layer. In some embodiments, the isolation structure 106 is made of silicon oxide, silicon nitride, silicon oxynitride, fluoride-doped silicate glass (FSG), other applicable dielectric materials, or a combination thereof. In some embodiments, the isolation structure 106 includes a shallow trench isolation (STI) structure.

Afterwards, dummy gate stacks 108 are formed across the semiconductor fin 100a and extend over the isolation structure 106, as shown in FIG. 1B in accordance with some embodiments. Each of the dummy gate stacks 108 may include a dummy gate dielectric layer 110, a dummy gate electrode layer 112, and a cap layer 113.

The dummy gate dielectric layers 110 may be made of silicon oxide, other applicable dielectric materials, or a combination thereof. The dummy gate electrode layers 112 may be made of poly-silicon, other applicable materials, or a combination thereof. The cap layers 113 may be made of silicon nitride, other applicable materials, or a combination thereof. The dummy gate dielectric layers 110, the dummy gate electrode layers 112, and the cap layers 113 may be formed by suitable deposition processes (e.g., chemical vapor deposition process).

After the dummy gate stacks 108 are formed, sidewall spacers 114 are formed on sidewalls of the dummy gate stacks 108, as shown in FIG. 1B in accordance with some embodiments. In some embodiments, the sidewall spacers 114 are made of silicon nitride, silicon oxide, other applicable materials, or a combination thereof. In some embodiments, the sidewall spacers 114 are formed by a deposition process (e.g., a chemical vapor deposition process) followed by an anisotropic etching process.

Afterwards, source/drain (S/D) structures 116 are formed over and/or in the semiconductor fin 100a, as shown in FIG. 1B in accordance with some embodiments. In some embodiments, portions of the semiconductor fin 100a adjacent to the dummy gate stacks 108 are recessed to form recesses, and a strained material is grown in the recesses by an epitaxial (epi) process to form the S/D structures 116. In addition, the lattice constant of the strained material may be different from the lattice constant of the semiconductor substrate 100. In some embodiments, the S/D structures 116 include Si, Ge, SiGe, InAs, InGaAs, InSb, GaAs, GaSb, InAlP, InP, other applicable materials, or a combination thereof.

Figure 2A:
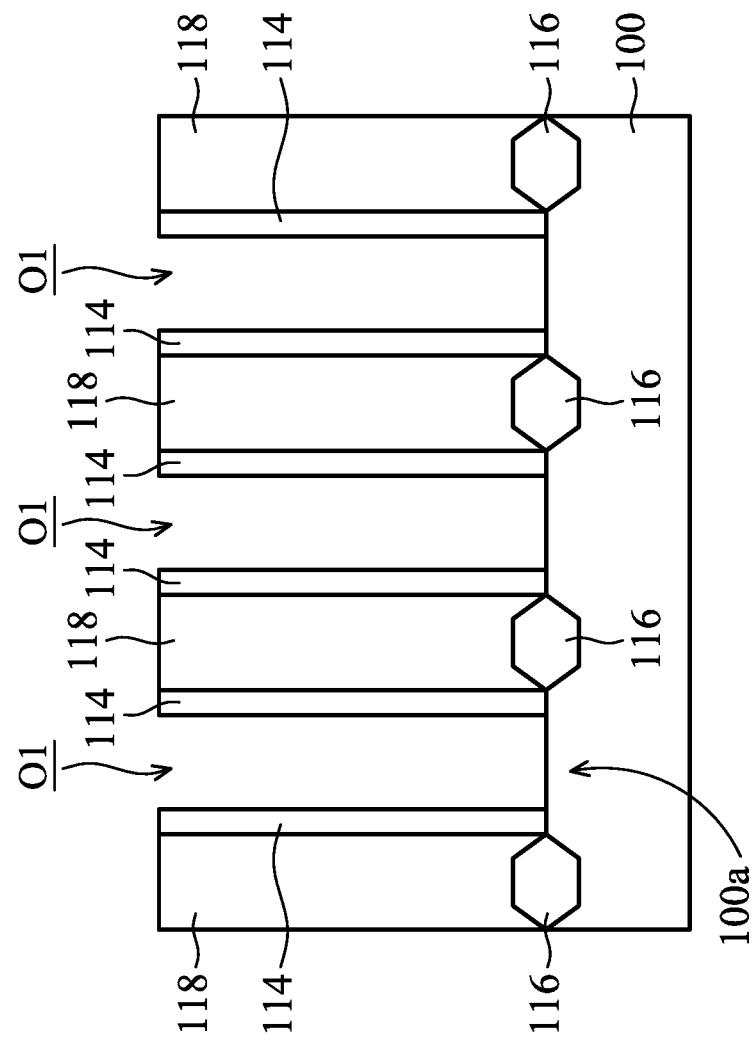
FIGS. 2A, 2B, 2C, 2D, 2E, 2F, 2G, 2H, 2I, 2J, 2K, and 2L are a series of cross-sectional views taken along line A-A' of FIG. 1C and illustrate various stages of a method for forming a semiconductor structure in accordance with some embodiments.

After the S/D structures 116 are formed, a dielectric layer (e.g., an interlayer dielectric layer) 118 is formed over the semiconductor substrate 100 and the semiconductor fin 100a, as shown in FIGS. 1C and 2A in accordance with some embodiments. The dielectric layer 118 may cover and/or surround the source/drain structures 116, as shown in FIGS. 1C and 2A. FIG. 2A is a cross-sectional view taken along line A-A' of FIG. 1C.

For example, the dielectric layer 118 may be made of silicon oxide, silicon oxynitride, tetraethoxysilane, phosphosilicate glass (PSG), borophosphosilicate glass (BPSG), fluorosilicate glass (FSG), hydrogen silsesquioxane (HSQ), other applicable dielectric materials, or a combination thereof. For example, the dielectric layer 118 may be formed using a chemical vapor deposition process, a spin-on coating process, another applicable process, or a combination thereof.

Afterwards, the dummy gate stacks 108 are removed to form trenches (or recesses or openings) O1 in the dielectric layer 118, as shown in FIGS. 1C and 2A in accordance with some embodiments. The trenches O1 may be formed using a dry etching process, a wet etching process, or a combination thereof.

Figure 2B:
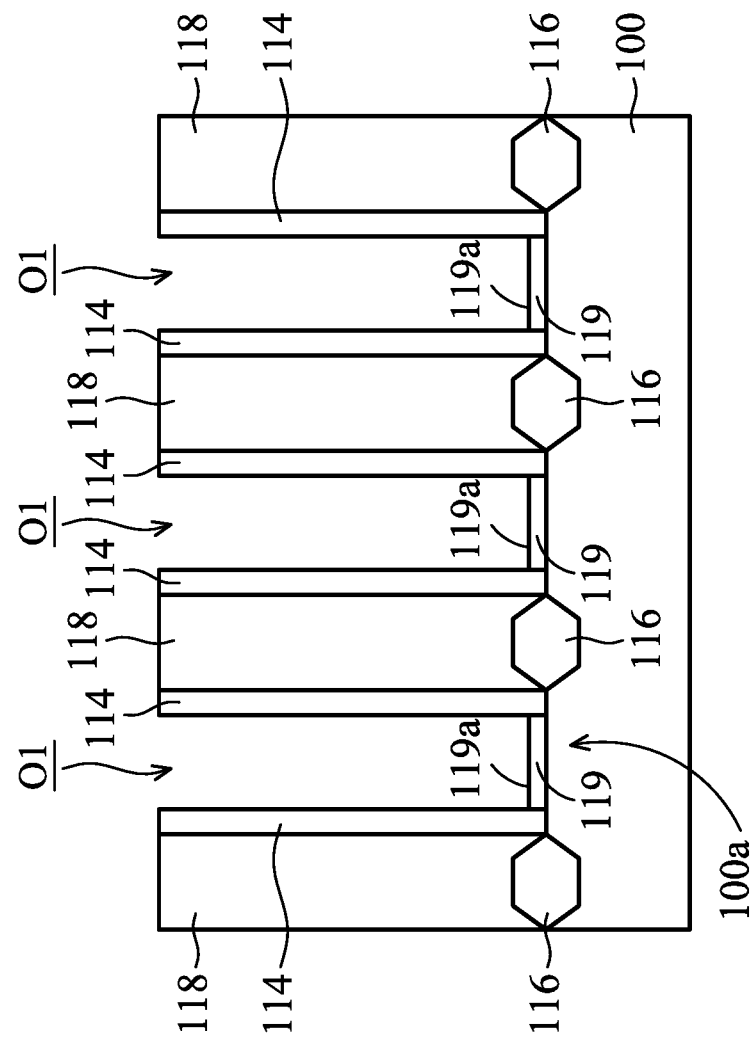

Afterwards, interfacial layers 119 are formed on the semiconductor fin 100a, as shown in FIG. 2B in accordance with some embodiments. In some embodiments, the interfacial layers 119 are formed on the top surface and sidewalls of the semiconductor fin 100a. In some embodiments, the interfacial layers 119 are formed on the portions of the semiconductor fin 100a that are exposed by the trenches O1. In some embodiments, at least a portion of the isolation structure 106 is not covered by the interfacial layers 119.

The interfacial layer 119 may have a surface (e.g., top surface) 119a, as shown in FIG. 2B. The surface 119a of the interfacial layer 119 may be exposed by the trench O1, as shown in FIG. 2B. In some embodiments, the interfacial layers 119 are oxide layers formed by oxidizing the top surface and/or the sidewalls of the semiconductor fin 100a.

In some embodiments, the interfacial layers 119 are oxide layers (e.g., silicon oxide layers, germanium oxide layers, other applicable oxide layers, or a combination thereof). In some embodiments, the surfaces 119a of the interfacial layers 119 include oxygen-containing bonds (e.g., Si—O bond, Ge—O bond, or the like, or a combination thereof).

For example, the interfacial layers 119 may be formed using a chemical vapor deposition (CVD) process, an atomic layer deposition (ALD) process, a thermal oxidation process, another applicable process, or a combination thereof.

Figure 2C:
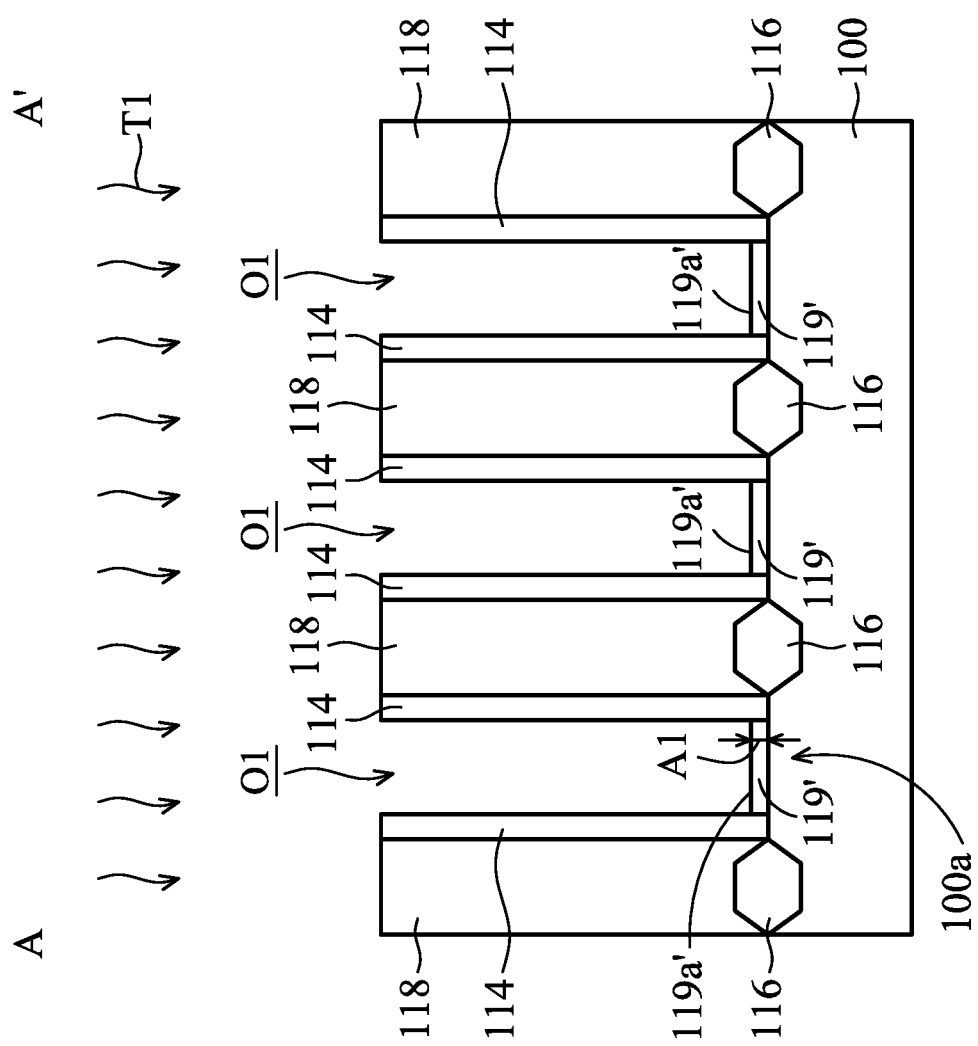

Afterwards, a treatment T1 is performed on the interfacial layers 119, as shown in FIG. 2C in accordance with some embodiments. After the treatment T1, the interfacial layers 119 may be referred to as the treated interfacial layers 119', as shown in FIG. 2C. Similarly, after the treatment T1, the surfaces 119a may be referred to as the treated surfaces 119a', as shown in FIG. 2C. The treated interfacial layer 119' may have a thickness A1, as shown in FIG. 2C. The thickness A1 may be in a range from about 10 angstrom to about 15 angstrom.

In some embodiments, the treatment T1 reduces the oxygen content of the interfacial layers 119, and thus the oxygen content of the treated interfacial layers 119' (i.e., the oxygen content after the treatment T1) is lower than the oxygen content of the interfacial layers 119 (i.e., the oxygen content before the treatment T1).

In some embodiments, the treatment T1 reduces the oxygen content at the surfaces 119a of the interfacial layers 119, and thus the oxygen content at the treated surfaces 119a' of the treated interfacial layers 119' (i.e., the oxygen content after the treatment T1) is lower than the oxygen content at the surfaces 119a of the interfacial layers 119 (the oxygen content before the treatment T1).

In some embodiments, the treatment T1 reduces the oxygen-containing bonds of the surfaces 119a, so that the oxygen content at the surfaces 119a is reduced. In some embodiments, the treatment T1 replaces at least some of the oxygen-containing bonds (e.g., Si—O bond, Ge—O bond, or the like, or a combination thereof) of the surfaces 119a with fluorine-containing bonds (e.g., Si—F bond, Ge—F bond, or the like, or a combination thereof), so as to form the treated surfaces 119a' having lower oxygen content and higher fluorine content. In some embodiments, the treated surfaces 119a' include fluorine-containing bonds (e.g., Si—F bond, Ge—F bond, or the like, or a combination thereof), and thus the treated surfaces 119a' may be referred to as the fluorinated surfaces 119a'.

In some embodiments, the treatment T1 includes treating the interfacial layers 119 with fluorine. In some embodiments, after treating the interfacial layers 119 with fluorine, some oxygen-containing bond of the surfaces 119a are replaced with fluorine-containing bonds.

In some embodiments, the treatment T1 includes fluorinating the surfaces 119a with a fluorine-containing plasma, a fluorine-containing gas, or a combination thereof, so that the treated surfaces (e.g., the fluorinated surfaces) 119a' are formed.

In some embodiments, the treatment T1 includes exposing the surfaces 119a of the interfacial layers 119 to a fluorine-containing plasma (e.g., $CF_4$ plasma, $SF_6$ plasma, another applicable fluorine-containing plasma, or a combination thereof), a fluorine-containing gas (e.g., $F_2$ gas, $CF_4$ gas, $SF_6$ gas, another applicable fluorine-containing gas, or a combination thereof), or a combination thereof. In some embodiments, the treatment T1 includes annealing the interfacial layers 119 in a fluorine-containing gas. In some embodiments, the surfaces 119a of the interfacial layers 119 react with fluorine (e.g., fluorine from the fluorine-containing plasma and/or fluorine from the fluorine-containing gas) to form the fluorine-containing bonds of the treated surfaces 119a'.

In some embodiments, the treatment T1 includes treating the surfaces 119a of the interfacial layers 119 with $CF_4$ plasma in a chamber. In some embodiments, $CF_4$ gas is introduced into the chamber at a flow rate in a range from about 500 sccm to about 1500 sccm, and a RF power in a range from about 500 W to about 2500 W is applied to generate the fluorine-containing plasma to treat the surfaces 119a of the interfacial layers 119. The above process parameters may be adjusted, so that the treated surfaces 119a' may have improved surface properties. In some embodiments, $H_2$ gas is also introduced into the chamber to react with the carbon in the chamber to form by-products that can be easily removed from the chamber, thus reducing undesirable residues remained at the treated surfaces 119a'.

In some embodiments, the treatment T1 includes treating the surfaces 119a of the interfacial layers 119 with $SF_6$ plasma in a chamber. In some embodiments, $SF_6$ gas is introduced into the chamber at a flow rate in a range from about 500 sccm to about 1500 sccm, and a RF power in a range from about 500 W to about 2500 W is applied to generate the fluorine-containing plasma to treat the surfaces 119a of the interfacial layers 119. The above process parameters may be adjusted, so that the treated surfaces 119a' may have improved surface properties.

In some embodiments, the treatment T1 includes annealing the interfacial layers 119 in $F_2$-containing gas. In some embodiments, the interfacial layers 119 are annealed in $F_2$-containing gas at an annealing temperature in a range from about 400° C. to about 600° C. for a duration in a range from about 30 seconds to about 600 seconds. The above process parameters may be adjusted, so that the treated surfaces 119a' may have improved surface properties.

In some embodiments, the treatment T1 includes annealing the interfacial layers 119 in $CF_4$-containing gas. In some embodiments, the interfacial layers 119 are annealed in $CF_4$-containing gas at an annealing temperature in a range from about 400° C. to about 600° C. for a duration in a range from about 30 seconds to about 600 seconds. The above process parameters may be adjusted, so that the treated surfaces 119a' may have improved surface properties.

In some embodiments, the treatment T1 includes annealing the interfacial layers 119 in $SF_6$-containing gas. In some embodiments, the interfacial layers 119 are annealed in $SF_6$-containing gas at an annealing temperature in a range from about 400° C. to about 600° C. for a duration in a range from about 30 seconds to about 600 seconds. The above process parameters may be adjusted, so that the treated surfaces 119a' may have improved surface properties.

Figure 2D:
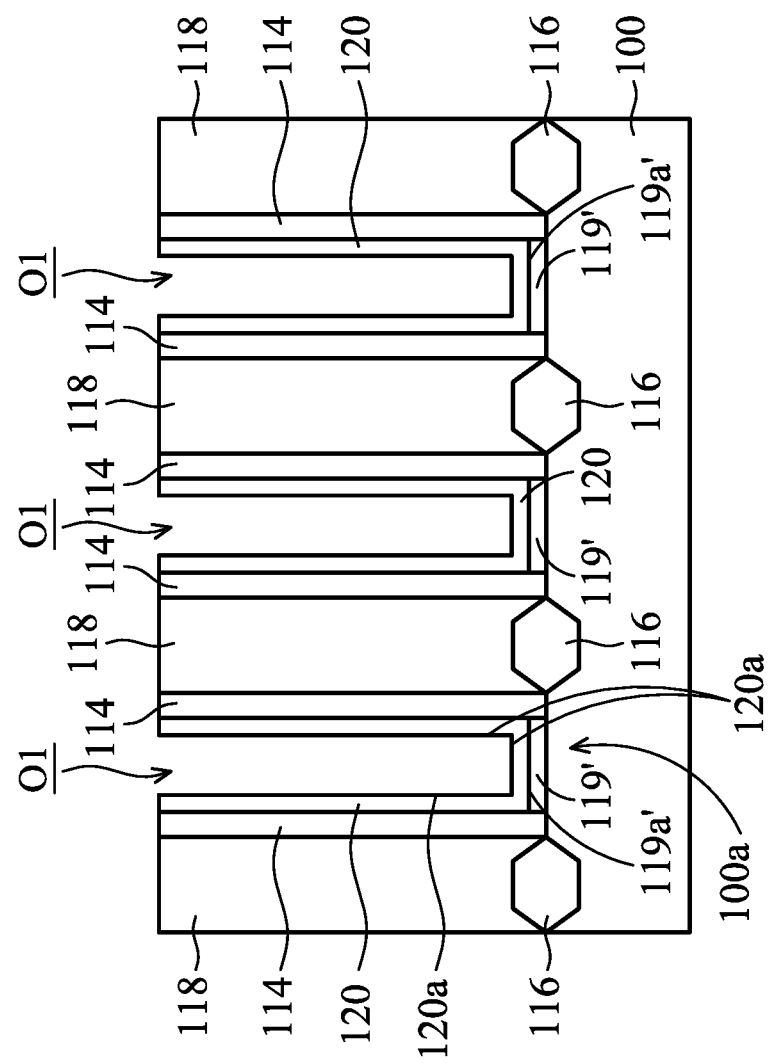

Afterwards, gate dielectric layers 120 are formed in the trenches O1, as shown in FIG. 2D in accordance with some embodiments. The gate dielectric layers 120 may conformally line the trenches O1, as shown in FIG. 2D. The gate dielectric layers 120 may be U-shaped, as shown in FIG. 2D.

In some embodiments, the gate dielectric layer 120 has a surface 120a. The surfaces 120a of the gate dielectric layers 120 may be exposed by the trenches O1, as shown in FIG. 2D.

In some embodiments, the gate dielectric layers 120 are metal oxide layers (e.g., crystalline metal oxide layers). In some embodiments, the surfaces 120a of the gate dielectric layers 120 include oxygen-containing bonds (e.g., M-O bond, where M represents the metal element of the metal oxide of the gate dielectric layer 120). For example, the surfaces 120a of the gate dielectric layers 120 may include Hf—O bonds when the gate dielectric layers 120 are made of hafnium oxide.

In some embodiments, the gate dielectric layers 120 are ferroelectric gate dielectric layers. Generally, ferroelectric gate dielectric layers have been employed to allow devices (e.g., FETs) to operate in a negative capacitance regime (e.g., in a negative-capacitance FET, or NCFET) for improved device performance.

For example, the ferroelectric gate dielectric layers may include a crystalline material (e.g., polycrystalline material). For example, the crystalline material may be a crystalline metal oxide (e.g., crystalline Hf-based oxides with orthorhombic phase (Pca21)). The orthorhombic phase (Pca21) may be detected by transmission electron microscope (TEM) diffraction.

In some embodiments, the gate dielectric layers (e.g., ferroelectric gate dielectric layers) 120 include high-k dielectric materials. The high-k dielectric materials may be metal oxides (e.g., crystalline metal oxides). The metal element of the metal oxide of the gate dielectric layer 120 may react with the oxygen of the surface of the interfacial layer (e.g., the surface 119a of the interfacial layer 119), forming a ferroelectric dead layer (not shown in the figures) between the interfacial layer 119 and the gate dielectric layer 120. The ferroelectric dead layer may undesirably depolarize the ferroelectricity of the gate dielectric layer 120. In particular, when the gate dielectric layer 120 is relatively thin (e.g., having a thickness in a range from 10 angstrom to about 30 angstrom), the gate dielectric layer 120 may be severely negatively affected by the ferroelectric dead layer. For example, the ferroelectric dead layer may include MSiOx, where M represents the metal element of the metal oxide of the gate dielectric layer 120.

In some embodiments, due to the treatment T1, the oxygen content of the treated surface 119a' of the treated interfacial layer 119' is relatively low. Therefore, the formation of the ferroelectricity dead layer may be reduced or avoided, reducing the undesirable depolarization of the ferroelectricity of the gate dielectric layer 120. Therefore, the device performance may be improved.

Examples of high-k dielectric materials include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layers 120 includes high-k dielectric materials doped with Zr, Al, Y, another applicable elements, or a combination thereof.

For example, the gate dielectric layers 120 may be formed using a deposition process (e.g., a chemical vapor deposition process, an atomic layer deposition process, a physical vapor deposition (PVD) process, another applicable process, or a combination thereof). For example, the deposition process may be performed at a temperature in a range from about 150° C. to about 350° C. An annealing process may be performed after the deposition process to improve the ferroelectricity of the gate dielectric layers 120. For example, the annealing process may be performed at an annealing temperature in a range from about 400° C. to about 600° C. for a duration in a range from about 30 seconds to about 600 seconds.

Figure 2E:
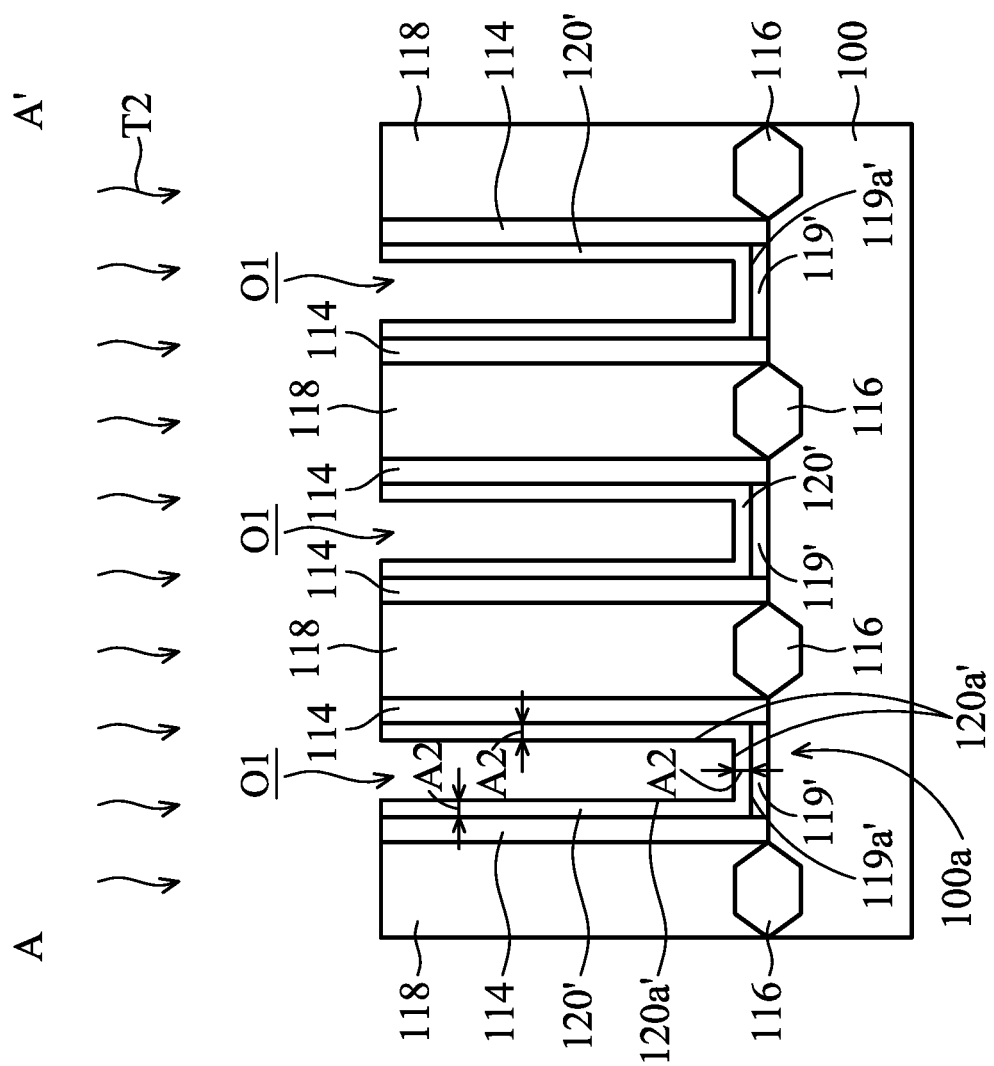

Afterwards, a treatment T2 is performed on the gate dielectric layers 120, as shown in FIG. 2E in accordance with some embodiments. After the treatment T2, the gate dielectric layers 120 may be referred to as the treated gate dielectric layers 120', as shown in FIG. 2E. Similarly, after the treatment T2, the surfaces 120a may be referred to as the treated surfaces 120a', as shown in FIG. 2E. The treated gate dielectric layer 120' may have a thickness A2, as shown in FIG. 2E. The thickness A2 may be in a range from about 10 angstrom to about 30 angstrom.

In some embodiments, the treatment T2 reduces the oxygen content of the gate dielectric layers 120, and thus the oxygen content of the treated gate dielectric layers 120' (i.e., the oxygen content after the treatment T2) is lower than the oxygen content of the gate dielectric layers 120 (i.e., the oxygen content before the treatment T2).

In some embodiments, the treatment T2 reduces the oxygen content at the surfaces 120a of the gate dielectric layers 120, and thus the oxygen content at the treated surfaces 120a' of the treated gate dielectric layers 120' (i.e., the oxygen content after the treatment T2) is lower than the oxygen content at the surfaces 120a of the gate dielectric layers 120 (the oxygen content before the treatment T2).

In some embodiments, the treatment T2 reduces the oxygen-containing bonds (e.g., M-O bond, where M (e.g., Hf) represents the metal element of the metal oxide of the gate dielectric layer 120) of the surfaces 120a, so that the oxygen content at the surfaces 120a is reduced. In some embodiments, the treatment T2 replaces at least some of the oxygen-containing bonds of the surfaces 120a with fluorine-containing bonds (e.g., M-F bond, where M (e.g., Hf) represents the metal element of the metal oxide of the gate dielectric layer 120), so as to form the treated surfaces 120a' having lower oxygen content and higher fluorine content. In some embodiments, the treated surfaces 120a' include fluorine-containing bonds (e.g., Hf—F bond), and thus the treated surfaces 120a' may be referred to as the fluorinated surfaces 120a'.

In some embodiments, the treatment T2 includes treating the gate dielectric layers 120 with fluorine. In some embodiments, after treating the gate dielectric layers 120 with fluorine, some oxygen-containing bond of the surfaces 120a are replaced with fluorine-containing bonds.

In some embodiments, the treatment T2 includes fluorinating the surfaces 120a with a fluorine-containing plasma, a fluorine-containing gas, or a combination thereof, so that the treated surfaces (e.g., the fluorinated surfaces) 120a' are formed.

In some embodiments, the treatment T2 includes exposing the surfaces 120a of the gate dielectric layers 120 to a fluorine-containing plasma (e.g., $CF_4$ plasma, $SF_6$ plasma, another applicable fluorine-containing plasma, or a combination thereof), a fluorine-containing gas (e.g., $F_2$ gas, $CF_4$ gas, $SF_6$ gas, another applicable fluorine-containing gas, or a combination thereof), or a combination thereof. In some embodiments, the treatment T2 includes annealing the gate dielectric layers 120 in a fluorine-containing gas. In some embodiments, the surfaces 120a of the gate dielectric layers 120 react with fluorine (e.g., fluorine from the fluorine-containing plasma and/or fluorine from the fluorine-containing gas) to form the fluorine-containing bonds of the treated surfaces 120a'.

In some embodiments, the treatment T2 includes treating the surfaces 120a of the gate dielectric layers 120 with $CF_4$ plasma in a chamber. In some embodiments, $CF_4$ gas is introduced into the chamber at a flow rate in a range from about 500 sccm to about 1500 sccm, and a RF power in a range from about 500 W to about 2500 W is applied to generate the fluorine-containing plasma to treat the surfaces 120a of the gate dielectric layers 120. The above process parameters may be adjusted, so that the treated surfaces 120a' may have improved surface properties. In some embodiments, $H_2$ gas is also introduced into the chamber to react with the carbon in the chamber to form by-products that can be easily removed from the chamber, thus reducing undesirable residues remained at the treated surfaces 120a'.

In some embodiments, the treatment T2 includes treating the surfaces 120a of the gate dielectric layers 120 with $SF_6$ plasma in a chamber. In some embodiments, $SF_6$ gas is introduced into the chamber at a flow rate in a range from about 500 sccm to about 1500 sccm, and a RF power in a range from about 500 W to about 2500 W is applied to generate the fluorine-containing plasma to treat the surfaces 120a of the gate dielectric layers 120. The above process parameters may be adjusted, so that the treated surfaces 120a' may have improved surface properties.

In some embodiments, the treatment T2 includes annealing the gate dielectric layers 120 in $F_2$-containing gas. In some embodiments, the gate dielectric layers 120 are annealed in $F_2$-containing gas at an annealing temperature in a range from about 400° C. to about 600° C. for a duration in a range from about 30 seconds to about 600 seconds. The above process parameters may be adjusted, so that the treated surfaces 120a' may have improved surface properties.

In some embodiments, the treatment T2 includes annealing the gate dielectric layers 120 in $CF_4$-containing gas. In some embodiments, the gate dielectric layers 120 are annealed in $CF_4$-containing gas at an annealing temperature in a range from about 400° C. to about 600° C. for a duration in a range from about 30 seconds to about 600 seconds. The above process parameters may be adjusted, so that the treated surfaces 120a' may have improved surface properties.

In some embodiments, the treatment T2 includes annealing the gate dielectric layers 120 in $SF_6$-containing gas. In some embodiments, the gate dielectric layers 120 are annealed in $SF_6$-containing gas at an annealing temperature in a range from about 400° C. to about 600° C. for a duration in a range from about 30 seconds to about 600 seconds. The above process parameters may be adjusted, so that the treated surfaces 120a' may have improved surface properties.

Figure 2F:
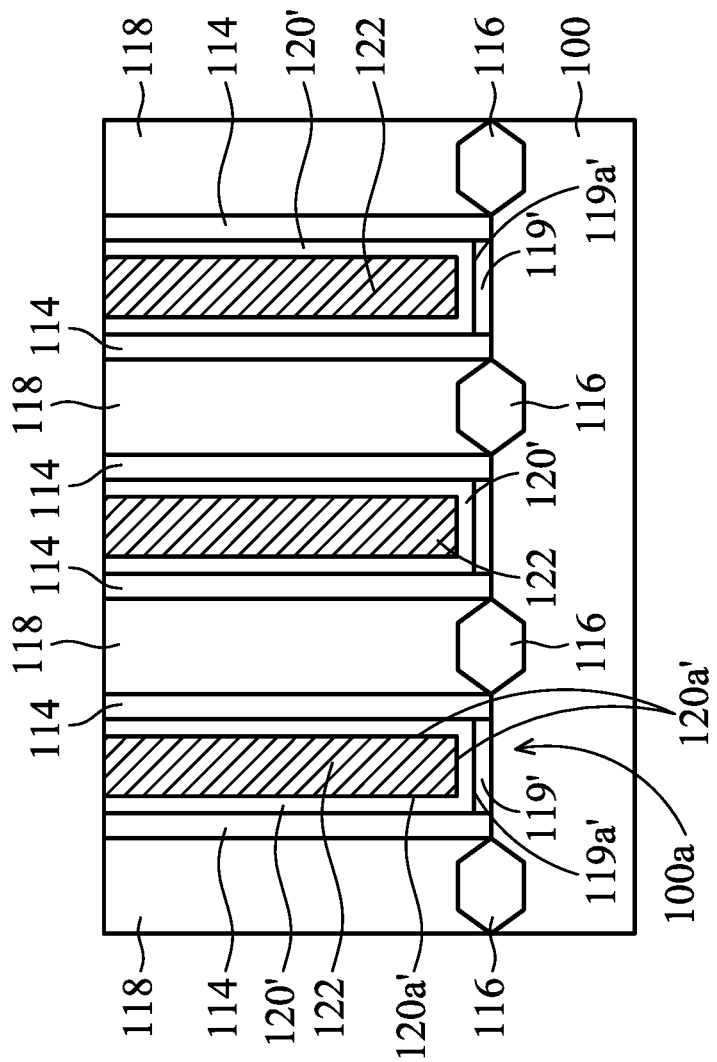

Afterwards, gate electrode layers 122 are formed on the treated gate dielectric layers 120' in the trenches O1, as shown in FIG. 2F in accordance with some embodiments. In some embodiments, the gate electrode layer 122 includes one or more metals. A gate electrode layer 122 combined with its corresponding treated gate dielectric layer 120' may be referred to as a gate stack or a metal gate stack.

The metal element of the gate electrode layer 122 may react with the oxygen of the surface of the gate dielectric layer (e.g., the surface 120a of the gate dielectric layer 120), forming a ferroelectric dead layer (not shown in the figures) between the gate dielectric layer 120 and the gate electrode layer 122. The ferroelectric dead layer may undesirably depolarize the ferroelectricity of the gate dielectric layer 120. In particular, when the gate dielectric layer 120 is relatively thin (e.g., having a thickness in a range from 10 angstrom to about 30 angstrom), the gate dielectric layer 120 may be severely negatively affected by the ferroelectric dead layer. For example, the ferroelectric dead layer may include MOx, where M represents the metal element of the gate electrode layer 122.

In some embodiments, due to the treatment T2, the oxygen content of the treated surface 120a' of the treated gate dielectric layer 120' is relatively low. Therefore, the formation of the ferroelectricity dead layer may be reduced or avoided, reducing the undesirable depolarization of the ferroelectricity of the gate dielectric layer 120. Therefore, the device performance may be improved.

In some embodiments, each of the gate electrode layers 122 includes a work function layer conformally formed on the treated gate dielectric layer 120'. The work function layer may include metal, metal carbide, metal nitride, another applicable material, or a combination thereof. For example, the work function layer may include tantalum, tantalum nitride, titanium, titanium nitride, another applicable material, or a combination thereof. For example, the work function layer may be formed using a physical vapor deposition process, a chemical vapor deposition process, an atomic layer deposition process, another applicable deposition process, or a combination thereof. For example, the deposition process may be performed at a temperature in a range from about 150° C. to about 550° C.

In some embodiments, each of the gate electrode layers 122 includes a gate conductive fill material formed on the treated gate dielectric layer 120'. The gate conductive fill material may be formed on the work function layer, and the work function layer may be located between the treated gate dielectric layer 120' and the gate conductive fill material. The gate conductive material may be surrounded by the work function layer. For example, the gate conductive fill material may include a metal (e.g., copper, molybdenum, nickel, platinum, ruthenium, another applicable metal, or a combination thereof). For example, the gate conductive fill material may be formed by a physical vapor deposition process, a chemical vapor deposition process, an atomic layer deposition process, another applicable deposition process, or a combination thereof. For example, the deposition process may be performed at a temperature in a range from about 150° C. to about 550° C.

Figure 2G:
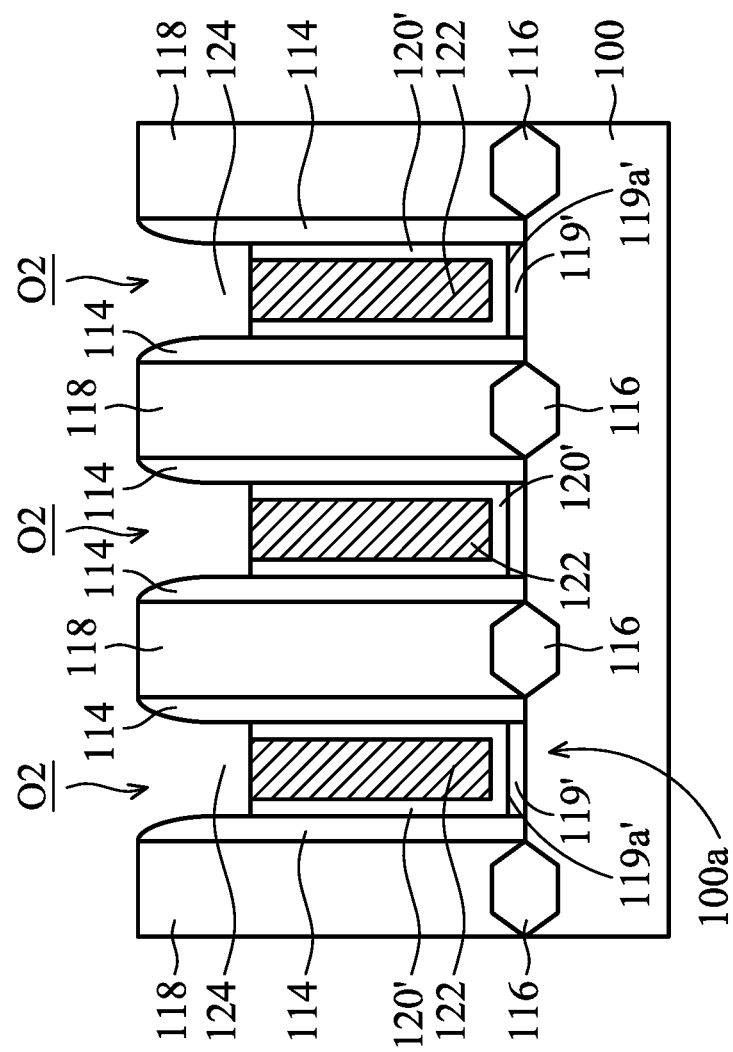

Afterwards, the gate electrode layers 122 and the treated gate dielectric layers 120' are recessed to form trenches (or recesses or openings) O2 in the dielectric layer 118, as shown in FIG. 2G in accordance with some embodiments.

For example, the trenches O2 may be formed by using an etching process (e.g., a dry etching process, a wet etching process, or a combination thereof). In some embodiments, the etching process removes the top portions of the treated gate dielectric layers 120', the top portions of the gate electrode layers 122, and/or the top portions of the sidewall spacers 114, as shown in FIG. 2G.

In some embodiments, in the etching process for forming the trenches O2, the etching rate of the sidewall spacers 114 is lower than the etching rate of the treated gate dielectric layers 120' and the etching rate of the gate electrode layers 122. The etching process for forming the trenches O2 may result in tapered top portions of the sidewall spacers 114, as shown in FIG. 2G.

Figure 2H:
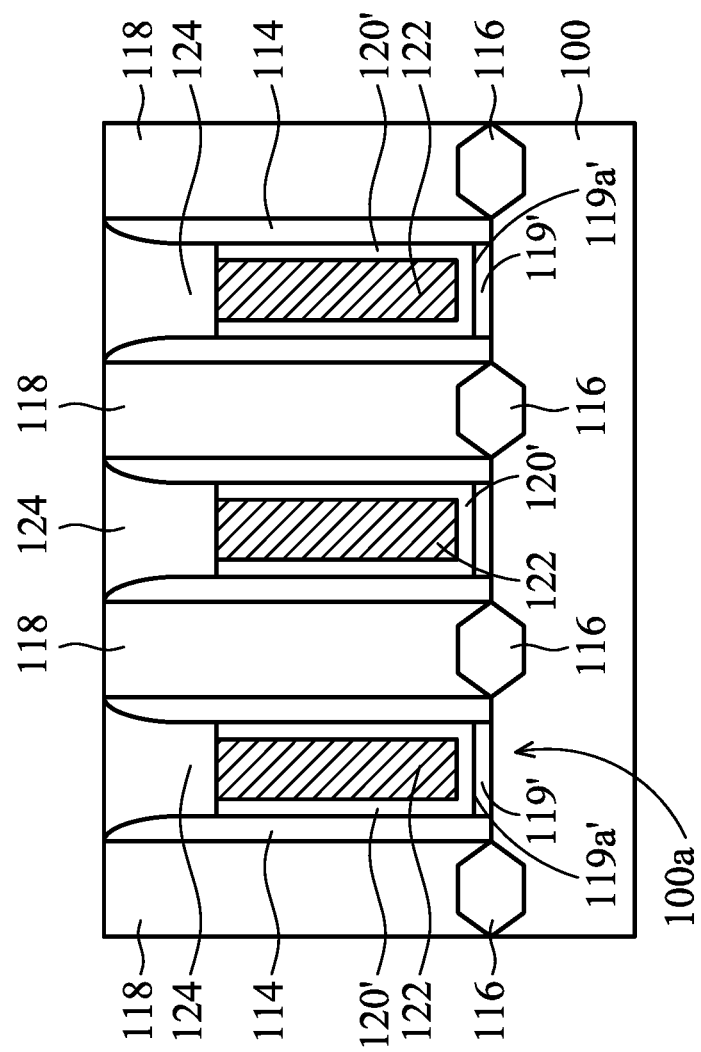

Afterwards, mask layers 124 are formed on the treated gate dielectric layers 120' and the gate electrode layers 122, as shown in FIG. 2H in accordance with some embodiments. In some embodiments, the mask layers 124 include ZrO, HfZrO, HfAlO, HfLaO, HfTiO, another applicable material, or a combination thereof. In some embodiments, the mask layers 124 include SiN, SiCN, SiOCN, other low K materials, or a combination thereof.

For example, the mask layers 124 may be formed using a chemical vapor deposition process, an atomic layer deposition process, another applicable process, or a combination thereof. A chemical mechanical polishing process may be performed on the mask layers 124, such that top surfaces of the mask layers 124 may be level with the top surface of the dielectric layer 118, as shown in FIG. 2H.

Figure 2I:
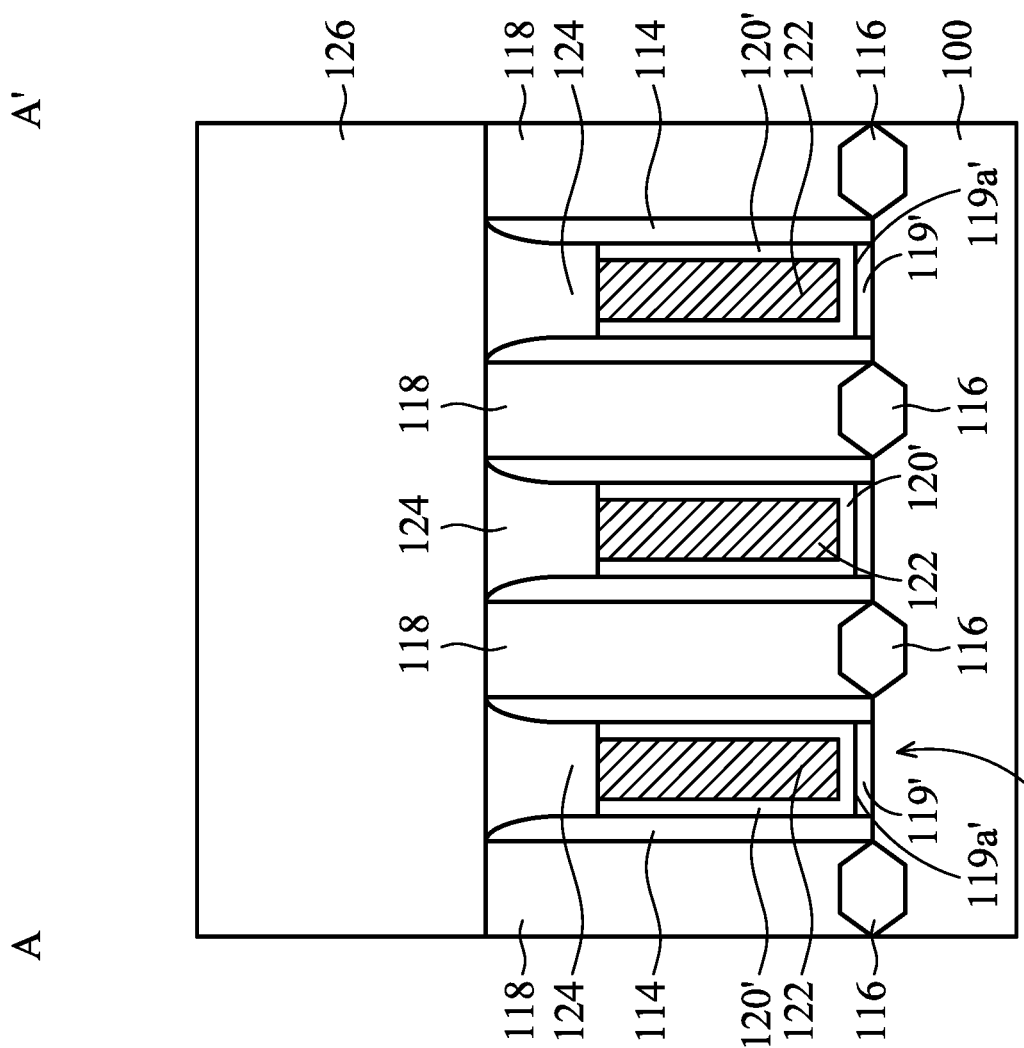

Afterwards, a dielectric layer 126 is formed on the dielectric layer 118 and the mask layers 124, as shown in FIG. 2I in accordance with some embodiments. For example, the dielectric layer 126 may be made of silicon oxide, silicon oxynitride, tetraethoxysilane, phosphosilicate glass (PSG), borophosphosilicate glass (BPSG), fluorosilicate glass (FSG), hydrogen silsesquioxane (HSQ), other applicable dielectric materials, or a combination thereof. For example, the dielectric layer 126 may be formed using a chemical vapor deposition process, a spin-on coating process, another applicable process, or a combination thereof.

Figure 2J:
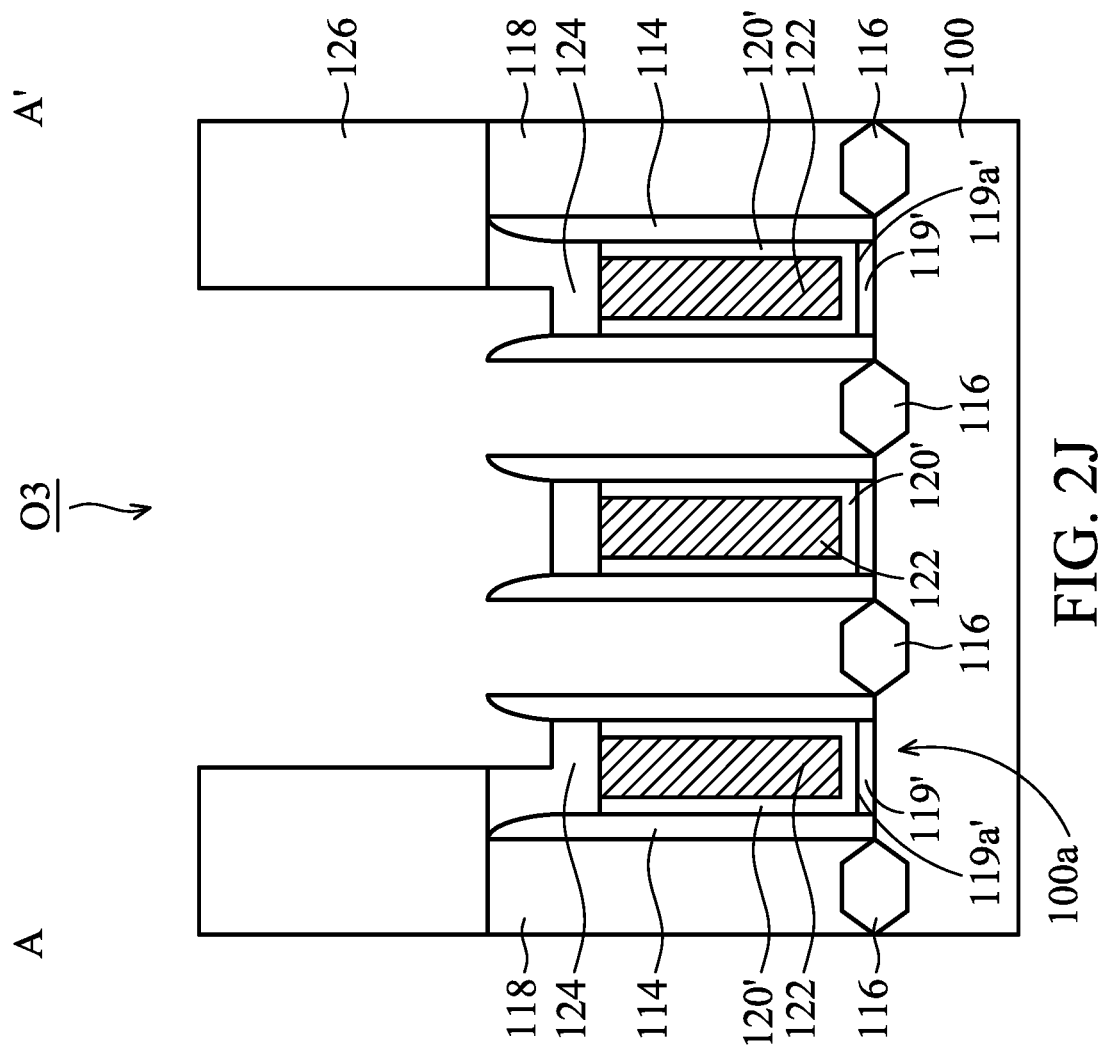

Afterwards, a trench O3 is formed to expose at least one of the S/D structures 116, as shown in FIG. 2J in accordance with some embodiments. In some embodiments, the trench O3 penetrates through the dielectric layer 126 and the dielectric layer 118 to expose the S/D structure(s) 116, as shown in FIG. 2J.

The trench O3 may be formed using a patterning process. The patterning process may remove portions of the dielectric layer 126 and the dielectric layer 118 to expose the S/D structure(s) 116. The patterning process may also remove the top portions of the mask layers 124, as shown in FIG. 2J. For example, the patterning process may include a photolithography process, an etching process, another applicable process, or a combination thereof. In some embodiments, in the etching process of the patterning process for forming the trench O3, the etching rate of the dielectric layer 126 is higher than the etching rate of the mask layers 124.

Figure 2K:
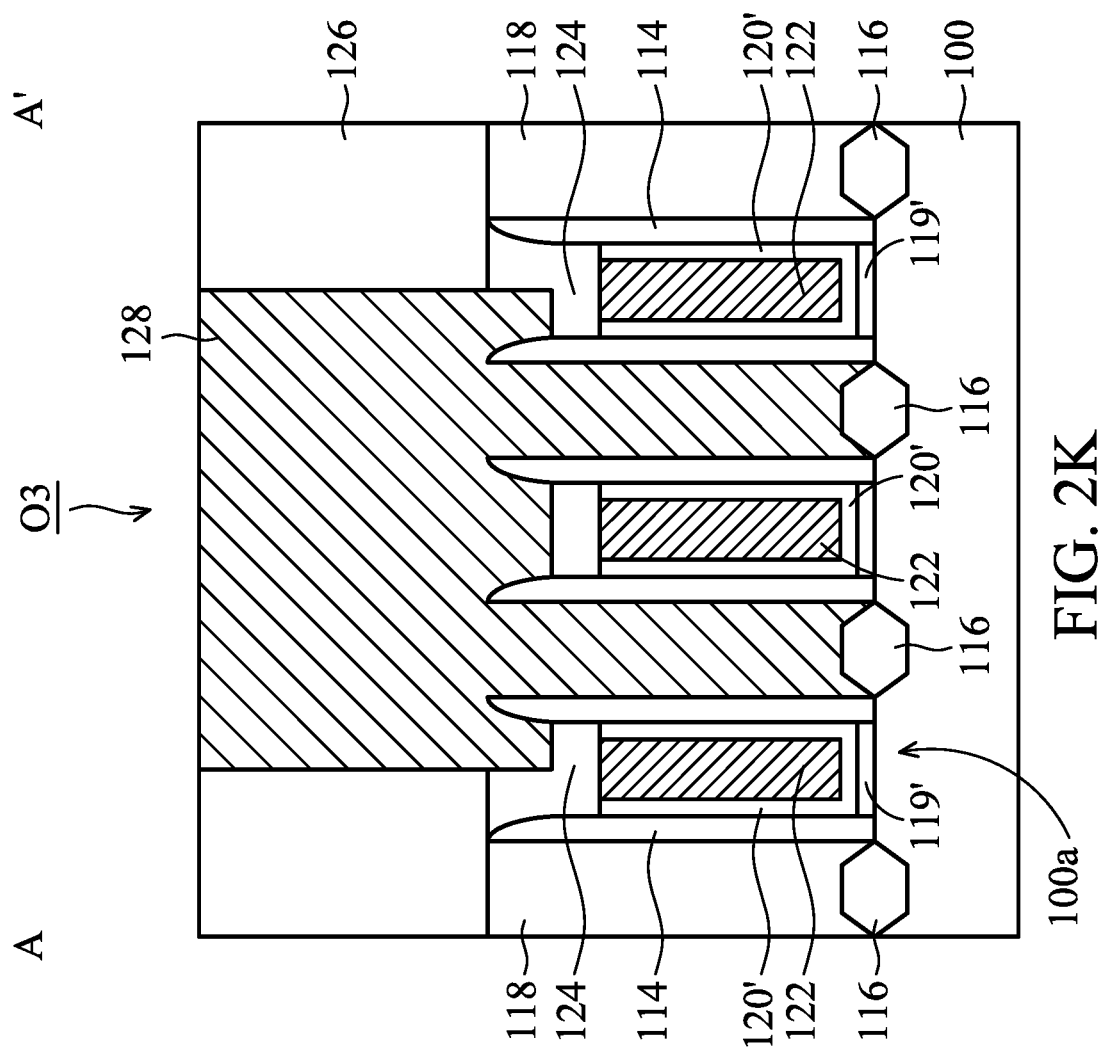

Afterwards, the trench O3 is filled with a conductive material 128, as shown in FIG. 2K in accordance with some embodiments. For example, the conductive material 128 may be formed using a physical vapor deposition process, an atomic layer deposition process, a plating process, another applicable process, or a combination thereof.

In some embodiments, the conductive material 128 includes cobalt, titanium, aluminum, copper, tantalum, platinum, molybdenum, silver, manganese, zirconium, ruthenium, another applicable conductive material, or a combination thereof.

In some embodiments, before the formation of the conductive material 128, silicide layers (not shown in the figures) are formed on the S/D structure(s) 116 exposed through the trench O3. The silicide layers may be formed by reacting upper portions of the S/D structure(s) 116 exposed through the trench O3 with metal layers formed on these S/D structure(s) 116. An annealing process may be performed to facilitate the reaction of these S/D structures 116 with these metal layers.

Figure 2L:
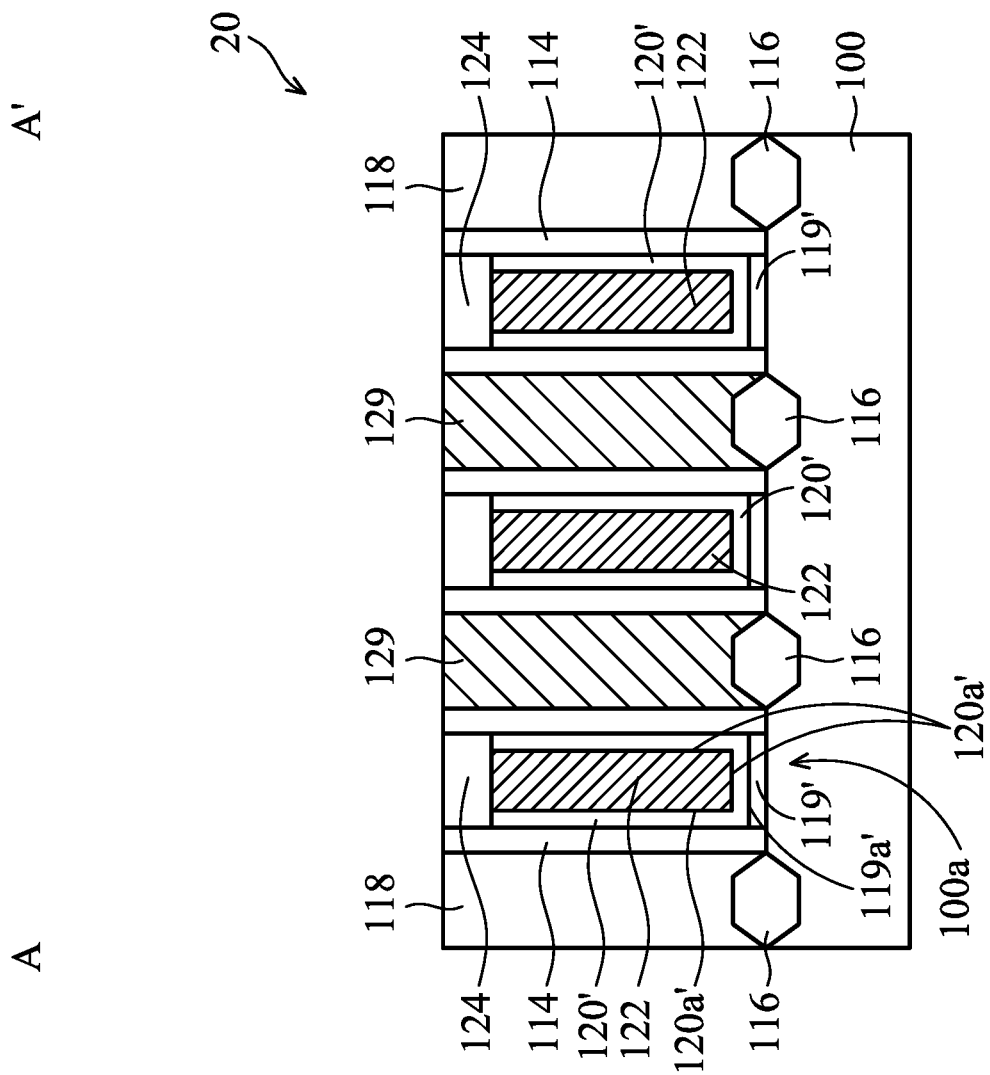

Afterwards, the top portion of the conductive material 128 is removed, so as to form a semiconductor structure 20, as shown in FIG. 2L in accordance with some embodiments. In some embodiments, after the top portion of the conductive material 128 is removed, the lower portion of the conductive material 128 remain on the S/D structure(s) 116 to serve as contact structure(s) 129, as shown in FIG. 2L. The contact structure(s) 129 may be electrically connected to the S/D structure(s) 116.

In some embodiments, a planarization process (e.g., a chemical mechanical polishing process) is performed to remove the top portion of the conductive material 128. In some embodiments, the planarization process removes the top portion of the conductive material 128, the dielectric layer 126, the top portion of the dielectric layer 118, the top portions of the sidewall spacers 114, and the top portions of the mask layers 124. In these embodiments, after the planarization process, the top surface(s) of the contact structure(s) 129 is level with the top surface of the dielectric layer 118, the top surfaces of the mask layers 124, and the top surfaces of the sidewall spacers 114.

Figure 3:
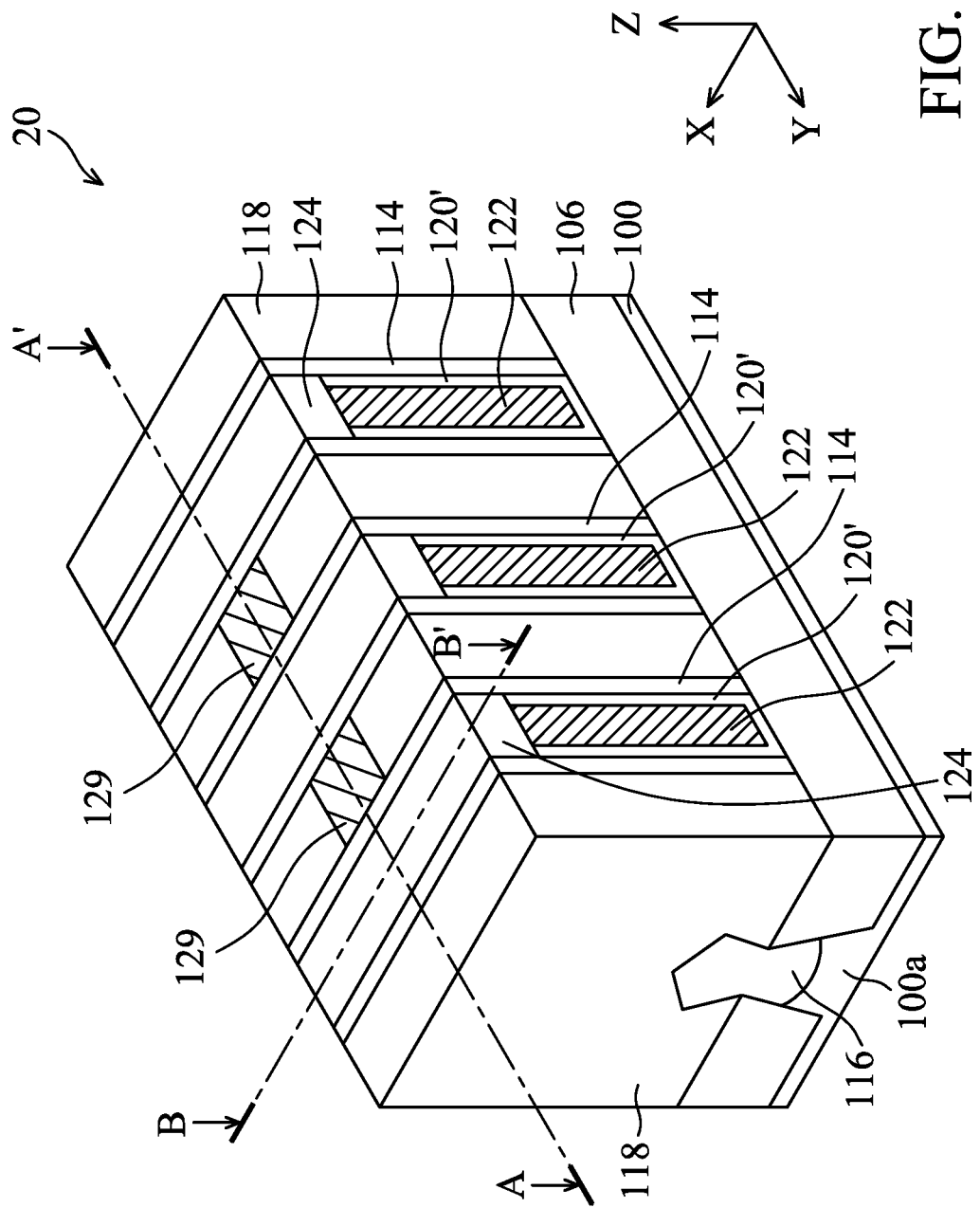
FIG. 3 illustrates a perspective view of a semiconductor structure in accordance with some embodiments
Figure 4:
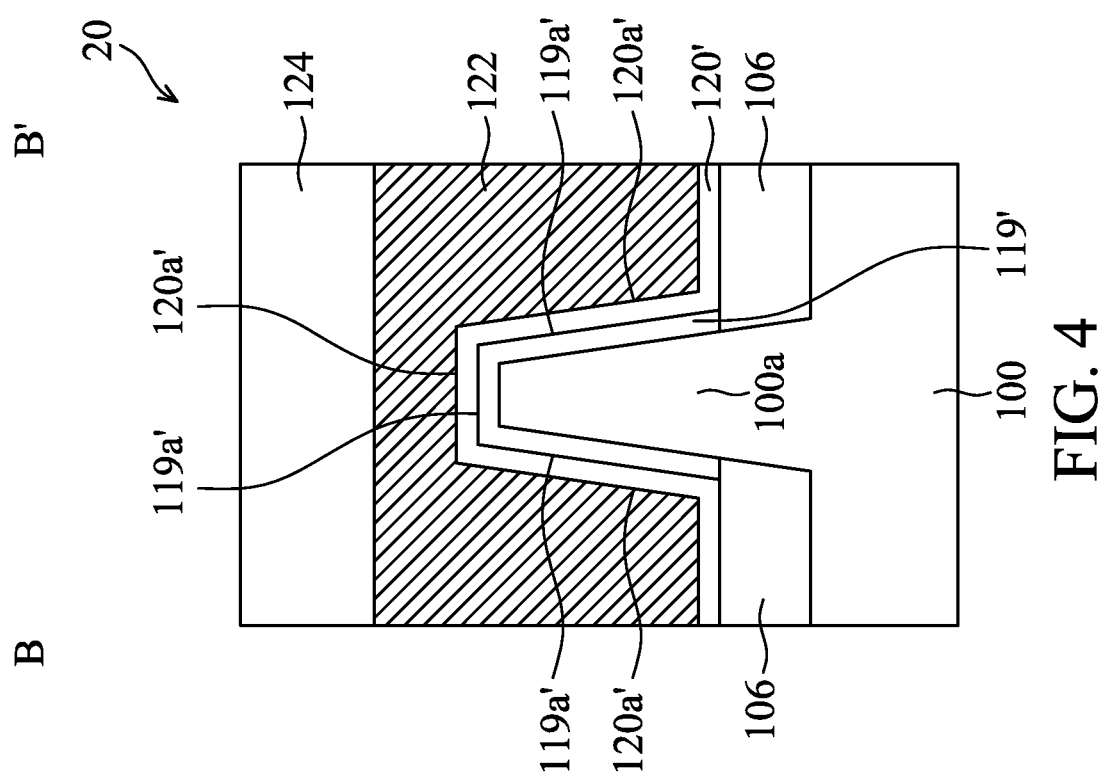
FIG. 4 illustrates a cross-sectional view of a semiconductor structure along line B-B' of FIG. 3 in accordance with some embodiments.

FIG. 3 illustrates a perspective view of the semiconductor structure 20, FIG. 2L illustrates a cross-sectional view of the semiconductor structure 20 along line A-A' of FIG. 3, and FIG. 4 illustrates a cross-sectional view of the semiconductor structure 20 along line B-B' of FIG. 3. In some embodiments, as shown in FIGS. 2L, 3 and 4, the semiconductor structure 20 includes the treated interfacial layer 119' and the treated gate dielectric layer 120'. In some embodiments, the treated surface 119a' (e.g., fluorinated surface) of the treated interfacial layer 119' and the treated surface 120a' (e.g., fluorinated surface) of the treated gate dielectric layer 120' can reduce or avoid the formation of the ferroelectricity dead layers, so that the performance of the semiconductor structure 20 is improved.

Figure 6:
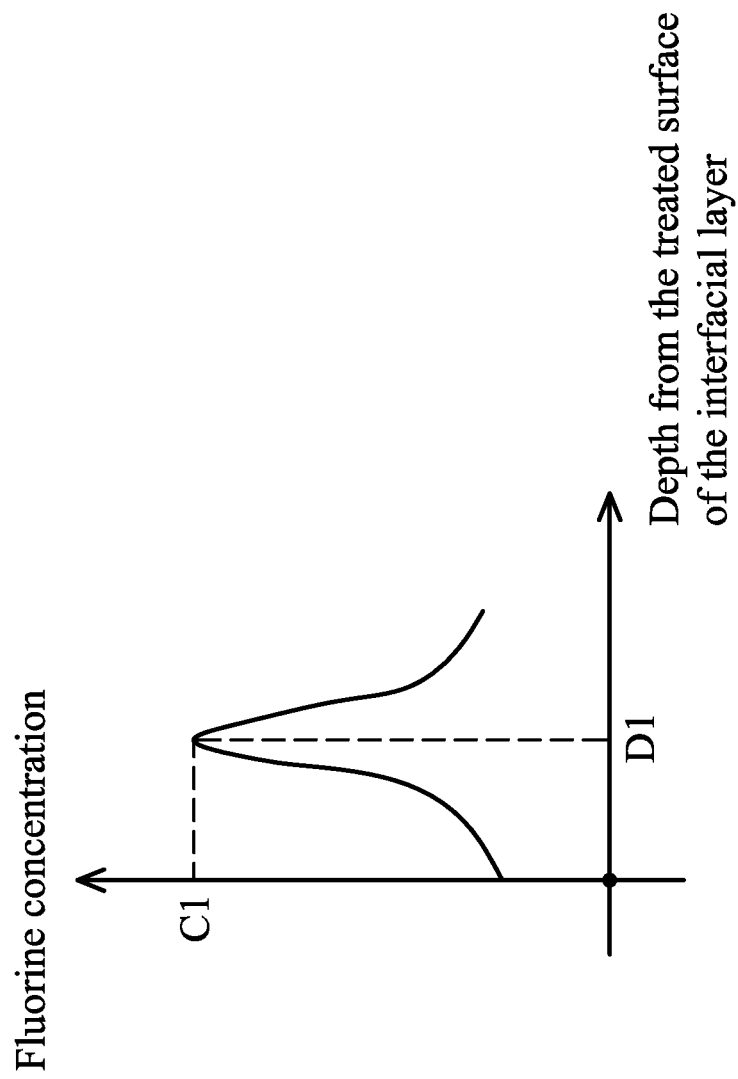
FIG. 6 illustrates a fluorine concentration profile of an interfacial layer in accordance with some embodiments.

FIG. 6 illustrates the fluorine concentration profile of the treated interfacial layer 119' in accordance with some embodiments. In some embodiments, at least partially due to the treatment T1, the treated interfacial layer 119' has a fluorine concentration profile peaking at the depth D1 from the treated surface 119a' of the treated interfacial layer 119'. The ratio of the depth D1 to the thickness A1 of treated interfacial layer 119' may be in a range from about 0.1 to about 0.5. The peak fluorine concentration C1 at the depth D1 may be in a range from about 3 at % to about 5 at %. The depth D1 may be in a range from about 3 angstrom to about 7 angstrom (e.g., 5 angstrom). The ratio of the depth D1 to the thickness A1, the depth D1, and/or the peak fluorine concentration C1 may be adjusted, so that the treated surface (e.g., fluorinated surface) 119a' which is desirable may be obtained without negatively affecting the function of the treated interfacial layer 119'.

Figure 7:
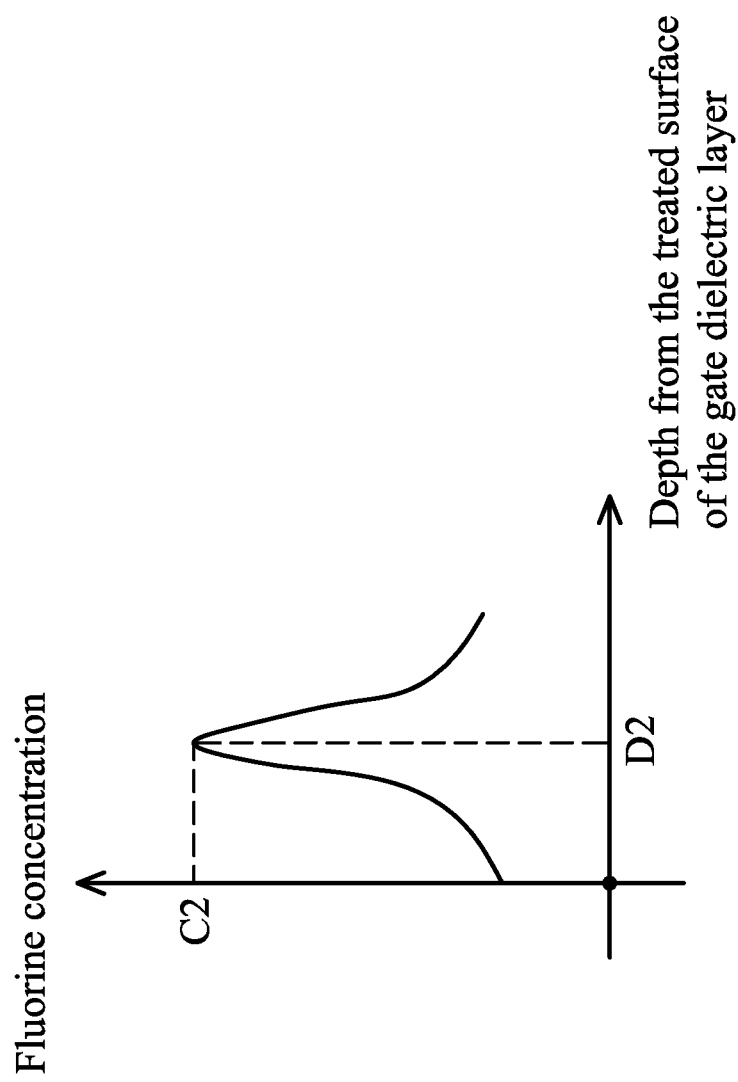
FIG. 7 illustrates a fluorine concentration profile of a gate dielectric layer in accordance with some embodiments.

FIG. 7 illustrates the fluorine concentration profile of the treated gate dielectric layers 120' in accordance with some embodiments. In some embodiments, at least partially due to the treatment T2, the treated gate dielectric layer 120' has a fluorine concentration profile peaking at the depth D2 from the treated surface 120a' of the treated gate dielectric layer 120'. The ratio of the depth D2 to the thickness A2 of treated gate dielectric layer 120' may be in a range from about 0.1 to about 0.5. The peak fluorine concentration C2 at the depth D2 may be in a range from about 3 at % to about 5 at %. The depth D2 may be in a range from about 3 angstrom to about 7 angstrom (e.g., 5 angstrom). The ratio of the depth D2 to the thickness A2, the depth D2, and/or the peak fluorine concentration C2 may be adjusted, so that the treated surface (e.g., fluorinated surface) 120a' which is desirable may be obtained without negatively affecting the function of the treated gate dielectric layer 120'.

In some embodiments, the gate dielectric layer 120 includes a crystalline material (e.g., polycrystalline material). The fluorine from the treatment T2 may diffuse into the grain boundaries of the crystalline material of the gate dielectric layer 120, so that the dangling bonds of the grain boundaries may be repaired. Therefore, the treated gate dielectric layer 120' may have an improved ferroelectricity.

Figure 5:
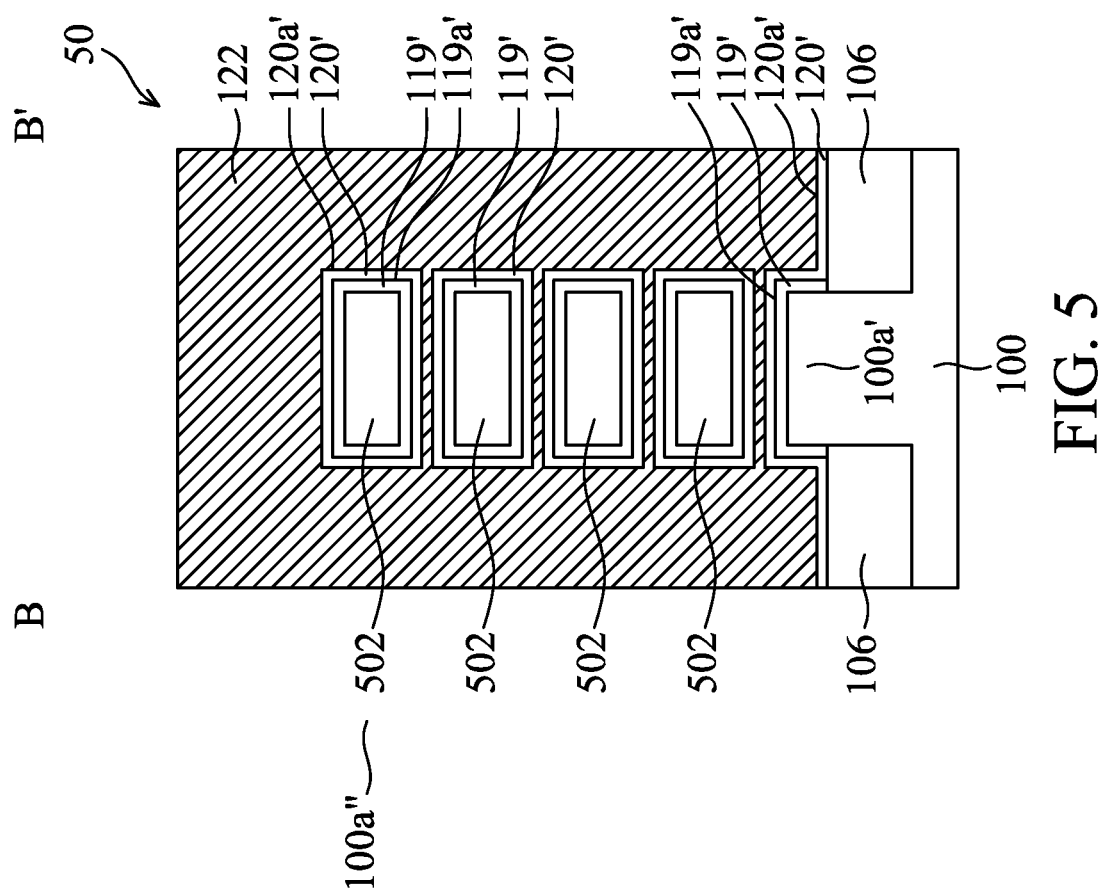
FIG. 5 illustrates a cross-sectional view of a semiconductor structure along line B-B' of FIG. 3 in accordance with some embodiments.

FIG. 5 illustrates a cross-sectional view of a semiconductor structure 50, in accordance with some embodiments of the present disclosure. One difference between the semiconductor structure 50 and the semiconductor structure 20 is that the semiconductor fin 100a of the semiconductor structure 50 includes a base fin portion 100a' and a nanosheet structure 100a" on the base fin portion 100a'. The lengthwise direction of the nanosheet structure 100a" may be the same as the lengthwise direction of the base fin portion 100a'.

In some embodiments, the nanosheet structure 100a" includes a plurality of nanosheets 502, as shown in FIG. 5. In some embodiments, four sides of each of the nanosheets 502 are surrounded by the treated interfacial layer 119', the treated gate dielectric layer 120' and the gate electrode layer 122, forming a so-called gate-all-around (GAA) structure. In some embodiments, the nanosheets 502 have rectangular cross sections as shown in FIG. 5. In some other embodiments, the nanosheets 502 have round cross sections, and thus they may be referred to as the nanowires 502.

In some embodiments, the nanosheets 502 serve as the channel regions of the semiconductor structure 50. For example, the nanosheets 502 may include Si, Ge, SiGe, InAs, InGaAs, InSb, GaAs, GaSb, InAlP, InP, other applicable materials, or a combination thereof.

As described previously, in some embodiments, the interfacial layer 119 and the gate dielectric layer 120 are treated with fluorine to form the treated interfacial layer 119' and the treated gate dielectric layer 120'. The oxygen content of the treated surface 119a' of the treated interfacial layer 119' and the oxygen content of the treated surface 120a' of the treated gate dielectric layer 120' may be low, so that the formation of the undesirable ferroelectric dead layer may be reduced or avoided. Therefore, the performance (e.g., the electrical performance) of the semiconductor structure 20 (or 50) may be improved.

Embodiments of methods for forming semiconductor structures are provided. The method includes forming an interfacial layer on a semiconductor fin, forming a gate dielectric layer on the interfacial layer, and forming a gate electrode layer on the gate dielectric layer. The interfacial layer and the gate dielectric layer may be treated with fluorine, so that the formation of the undesirable ferroelectric dead layer may be reduced or prevented. Therefore, the ferroelectricity of the gate dielectric layer may be improved, which may improve the performance of the semiconductor structure.

In some embodiments, a method for forming a semiconductor structure is provided. The method includes patterning a semiconductor substrate to form a semiconductor fin, forming a source/drain structure on the semiconductor fin, forming an interfacial layer on the semiconductor fin, treating the interfacial layer with fluorine, forming a ferroelectric gate dielectric layer on the interfacial layer, treating the ferroelectric gate dielectric layer with fluorine, and forming a gate electrode layer on the ferroelectric gate dielectric layer.

In some embodiments, a method for forming a semiconductor structure is provided. The method includes patterning a semiconductor substrate to form a semiconductor fin, forming a source/drain structure on the semiconductor fin, forming a first oxide layer on the semiconductor fin, fluorinating a surface of the first oxide layer, and forming a gate dielectric layer on the surface of the first oxide layer. The gate dielectric layer includes a crystalline metal oxide. The method also includes fluorinating a surface of the gate dielectric layer, and forming a gate electrode layer on the surface of the gate dielectric layer.

In some embodiments, a semiconductor structure is provided. The semiconductor structure includes a semiconductor fin on a semiconductor substrate, and an interfacial layer on the semiconductor fin. The interfacial layer includes a first fluorinated surface. The semiconductor structure also includes a gate dielectric layer on the first fluorinated surface of the interfacial layer. The gate dielectric layer includes a second fluorinated surface. The semiconductor structure also includes a gate electrode layer on the second fluorinated surface of the gate dielectric layer, and a source/drain structure on the semiconductor fin and adjacent to the gate electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    patterning a semiconductor substrate to form a semiconductor fin;
    forming a source/drain structure on the semiconductor fin;
    forming an interfacial layer on the semiconductor fin;
    treating the interfacial layer with fluorine;
    forming a ferroelectric gate dielectric layer on the interfacial layer;
    treating an exposed surface of the ferroelectric gate dielectric layer with fluorine, wherein the ferroelectric gate dielectric layer has a peak fluorine concentration at a depth from the exposed surface of the ferroelectric gate dielectric layer after the treating the exposed surface of the ferroelectric gate dielectric layer with fluorine, and a ratio of the depth to a thickness of the ferroelectric gate dielectric layer is in a range from about 0.1 to about 0.5; and
    forming a gate electrode layer on the ferroelectric gate dielectric layer.

2. The method for forming a semiconductor structure as claimed in claim 1, wherein the treating the interfacial layer with fluorine comprises exposing a surface of the interfacial layer to a fluorine-containing plasma, a fluorine-containing gas, or a combination thereof.

3. The method for forming a semiconductor structure as claimed in claim 1, wherein the treating the exposed surface of the ferroelectric gate dielectric layer with fluorine comprises treating the exposed surface of the ferroelectric gate dielectric layer to a fluorine-containing plasma, a fluorine-containing gas, or a combination thereof.

4. The method for forming a semiconductor structure as claimed in claim 1, wherein an oxygen content of the interfacial layer is reduced after the treating the interfacial layer with fluorine.

5. The method for forming a semiconductor structure as claimed in claim 1, wherein an oxygen content of the ferroelectric gate dielectric layer is reduced after the treating the ferroelectric gate dielectric layer with fluorine.

6. The method for forming a semiconductor structure as claimed in claim 1, wherein the ferroelectric gate dielectric layer comprises a crystalline material.

7. The method for forming a semiconductor structure as claimed in claim 1, wherein the treating the interfacial layer with fluorine comprises annealing the interfacial layer in a fluorine-containing gas.

8. The method for forming a semiconductor structure as claimed in claim 1, wherein the treating an exposed surface of the ferroelectric gate dielectric layer with fluorine comprises annealing the ferroelectric gate dielectric layer in a fluorine-containing gas.

9. A method for forming a semiconductor structure, comprising:
    patterning a semiconductor substrate to form a semiconductor fin;
    forming a source/drain structure on the semiconductor fin;
    forming a first oxide layer on the semiconductor fin;
    fluorinating a surface of the first oxide layer, wherein the first oxide layer has a peak fluorine concentration at a depth from the surface of the first oxide layer after the fluorinating the surface of the first oxide layer, and a ratio of the depth to a thickness of the first oxide layer is in a range from about 0.1 to about 0.5;
    forming a gate dielectric layer on the surface of the first oxide layer, wherein the gate dielectric layer comprises a crystalline metal oxide;
    fluorinating a surface of the gate dielectric layer; and
    forming a gate electrode layer on the surface of the gate dielectric layer.

10. The method for forming a semiconductor structure as claimed in claim 9, wherein an oxygen content at the surface of the first oxide layer is reduced after the fluorinating the surface of the first oxide layer.

11. The method for forming a semiconductor structure as claimed in claim 9, wherein an oxygen content at the surface of the gate dielectric layer is reduced after the fluorinating the surface of the gate dielectric layer.

12. The method for forming a semiconductor structure as claimed in claim 9, wherein the fluorinating the surface of the first oxide layer comprises exposing the surface of the first oxide layer to a fluorine-containing plasma.

13. The method for forming a semiconductor structure as claimed in claim 9, wherein the fluorinating the surface of the first oxide layer comprises annealing the first oxide layer in a fluorine-containing gas.

14. The method for forming a semiconductor structure as claimed in claim 9, wherein the fluorinating the surface of the gate dielectric layer comprises exposing the surface of the gate dielectric layer to a fluorine-containing plasma.

15. The method for forming a semiconductor structure as claimed in claim 9, wherein the fluorinating the surface of the gate dielectric layer comprises annealing the gate dielectric layer in a fluorine-containing gas.

16. The method for forming a semiconductor structure as claimed in claim 9, wherein the gate dielectric layer has a peak fluorine concentration at a depth from the surface of the gate dielectric layer after the fluorinating the surface of the gate dielectric layer, and a ratio of the depth to a thickness of the gate dielectric layer is in a range from about 0.1 to about 0.5.

17. A method for forming a semiconductor structure, comprising:
    forming a semiconductor fin on a semiconductor substrate;
    forming a source/drain structure on the semiconductor fin;
    forming an interfacial layer on the semiconductor fin;
    reducing an oxygen content of the interfacial layer by treating the interfacial layer with a fluorine-containing plasma, a fluorine-containing gas, or a combination thereof, wherein reducing the oxygen content of the interfacial layer comprises replacing oxygen-containing bonds of a surface of the interfacial layer with fluorine-containing bonds, and the interfacial layer has a peak fluorine concentration at a depth from the surface of the interfacial layer after the replacing oxygen-containing bonds of the surface of the interfacial layer with fluorine-containing bonds, and a ratio of the depth to a thickness of the interfacial layer is in a range from about 0.1 to about 0.5;

forming a gate dielectric layer on the interfacial layer; and forming a gate electrode layer on the gate dielectric layer.

18. The method for forming a semiconductor structure as claimed in claim 17, further comprising:

reducing an oxygen content of the gate dielectric layer, wherein reducing the oxygen content of the gate dielectric layer comprises replacing oxygen-containing bonds of a surface of the gate dielectric layer with fluorine-containing bonds.

19. The method for forming a semiconductor structure as claimed in claim 18, wherein reducing the oxygen content of the interfacial layer is prior to reducing the oxygen content of the gate dielectric layer.

20. The method for forming a semiconductor structure as claimed in claim 18, wherein reducing the oxygen content of the gate dielectric layer comprises exposing the surface of the gate dielectric layer to a fluorine-containing plasma, a fluorine-containing gas, or a combination thereof.

* * * * *